(12) United States Patent
Su et al.

(10) Patent No.: US 11,094,541 B2
(45) Date of Patent: Aug. 17, 2021

(54) ANTI-REFLECTIVE COATING MATERIALS

(71) Applicant: Taiwan Semiconductor Manufacturing Co., Ltd., Hsinchu (TW)

(72) Inventors: Yu-Chung Su, Hsinchu (TW); Ching-Yu Chang, Yuansun Village (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 16/934,270

(22) Filed: Jul. 21, 2020

(65) Prior Publication Data

US 2020/0350155 A1 Nov. 5, 2020

Related U.S. Application Data

(60) Division of application No. 16/226,274, filed on Dec. 19, 2018, now Pat. No. 10,755,927, which is a division of application No. 15/701,097, filed on Sep. 11, 2017, now Pat. No. 10,163,631, which is a continuation of application No. 14/457,902, filed on Aug. 12, 2014, now Pat. No. 9,761,449.

(Continued)

(51) Int. Cl.
| | |
|---|---|
| *H01L 29/08* | (2006.01) |
| *H01L 21/027* | (2006.01) |
| *H01L 21/02* | (2006.01) |
| *G03F 7/09* | (2006.01) |

(52) U.S. Cl.
CPC .......... *H01L 21/0276* (2013.01); *G03F 7/091* (2013.01); *H01L 21/02118* (2013.01)

(58) Field of Classification Search
CPC .......... H01L 21/0276; H01L 21/02118; H01L 21/76224; G03F 7/091
See application file for complete search history.

(56) References Cited

U.S. PATENT DOCUMENTS

| | | | |
|---|---|---|---|
| 4,011,168 | A | 3/1977 | Uhlmann |
| 4,072,527 | A | 2/1978 | Fan |

(Continued)

FOREIGN PATENT DOCUMENTS

| | | |
|---|---|---|
| CN | 1628269 A | 6/2005 |
| CN | 1942826 A | 4/2007 |

(Continued)

OTHER PUBLICATIONS

Hoo, Ng Wah et al., "The Effect of UPW Quality on Photolithography Defect," Proc. SPIE 7520, Lithography Asia 2009, Dec. 14, 2009, 7 pages, vol. 7520, SPIE, Taipei, Taiwan.

(Continued)

*Primary Examiner* — Caleb E Henry
(74) *Attorney, Agent, or Firm* — Slater Matsil, LLP

(57) ABSTRACT

In accordance with an embodiment a bottom anti-reflective layer comprises a surface energy modification group which modifies the surface energy of the polymer resin to more closely match a surface energy of an underlying material in order to help fill gaps between structures. The surface energy of the polymer resin may be modified by either using a surface energy modifying group or else by using an inorganic structure.

20 Claims, 8 Drawing Sheets

Related U.S. Application Data

(60) Provisional application No. 61/921,853, filed on Dec. 30, 2013.

(56) References Cited

U.S. PATENT DOCUMENTS

| | | |
|---|---|---|
| 4,212,935 A | 7/1980 | Canavello et al. |
| 4,268,601 A | 5/1981 | Namiki et al. |
| 4,289,845 A | 9/1981 | Bowden et al. |
| 4,346,164 A | 8/1982 | Tabarelli et al. |
| 4,491,628 A | 1/1985 | Ito et al. |
| 4,663,275 A | 5/1987 | West et al. |
| 4,777,119 A | 10/1988 | Brault et al. |
| 4,939,070 A | 7/1990 | Brunsvold et al. |
| 5,002,850 A | 3/1991 | Shinozaki et al. |
| 5,104,692 A | 4/1992 | Belmares |
| 5,173,368 A | 12/1992 | Belmares |
| 5,268,260 A | 12/1993 | Bantu et al. |
| 5,288,588 A | 2/1994 | Yukawa et al. |
| 5,738,975 A | 4/1998 | Nakano et al. |
| 5,750,312 A | 5/1998 | Chandross et al. |
| 5,766,824 A | 6/1998 | Batchelder et al. |
| 5,856,065 A | 1/1999 | Hagen |
| 5,863,710 A | 1/1999 | Wakiya et al. |
| 5,886,102 A | 3/1999 | Sinta et al. |
| 5,889,141 A | 3/1999 | Marrocco, III et al. |
| 6,008,265 A | 12/1999 | Vallee et al. |
| 6,147,249 A | 11/2000 | Watanabe et al. |
| 6,187,504 B1 | 2/2001 | Suwa et al. |
| 6,306,554 B1 | 10/2001 | Barclay et al. |
| 6,503,689 B2 | 1/2003 | Zampini et al. |
| 6,627,377 B1 | 9/2003 | Itatani et al. |
| 6,787,289 B2 | 9/2004 | Yamada et al. |
| 6,788,477 B2 | 9/2004 | Lin |
| 6,790,579 B1 | 9/2004 | Goodall et al. |
| 6,835,527 B2 | 12/2004 | Takata et al. |
| 6,852,473 B2 | 2/2005 | Roberts et al. |
| 6,872,503 B2 | 3/2005 | Wheland et al. |
| 6,875,554 B2 | 4/2005 | Hatanaka et al. |
| 6,936,400 B2 | 8/2005 | Takasu et al. |
| 6,952,253 B2 | 10/2005 | Lof et al. |
| 6,991,888 B2 | 1/2006 | Padmanaban et al. |
| 7,195,860 B2 | 3/2007 | Endo et al. |
| 7,235,348 B2 | 6/2007 | Ho et al. |
| 7,264,918 B2 | 9/2007 | Endo et al. |
| 7,312,014 B2 | 12/2007 | Maesawa et al. |
| 7,320,855 B2 | 1/2008 | Huang et al. |
| 7,344,970 B2 | 3/2008 | Forman et al. |
| 7,362,412 B2 | 4/2008 | Holmes et al. |
| 7,393,624 B2 | 7/2008 | Allen et al. |
| 7,432,035 B2 | 10/2008 | Maeda et al. |
| 7,432,042 B2 | 10/2008 | Chang et al. |
| 7,460,206 B2 | 12/2008 | Weissenrieder et al. |
| 7,470,503 B1 | 12/2008 | Brandl |
| 7,582,398 B2 | 9/2009 | Iftime et al. |
| 7,585,612 B2 | 9/2009 | Thackeray et al. |
| 7,595,141 B2 | 9/2009 | Kudo et al. |
| 7,608,386 B2 | 10/2009 | Nozaki et al. |
| 7,648,815 B2 | 1/2010 | Itatani et al. |
| 7,718,541 B2 | 5/2010 | Makiyama et al. |
| 7,733,459 B2 | 6/2010 | Dierichs et al. |
| 7,738,074 B2 | 6/2010 | Streefkerk et al. |
| 7,779,781 B2 | 8/2010 | Mertens et al. |
| 7,824,837 B2 | 11/2010 | Wu et al. |
| 7,846,637 B2 | 12/2010 | Ishizuka et al. |
| 7,879,529 B2 | 2/2011 | Endo et al. |
| 7,919,222 B2 | 4/2011 | Vohra et al. |
| 7,959,141 B2 | 6/2011 | Makino |
| 7,985,534 B2 | 7/2011 | Tsubaki |
| 7,989,578 B2 | 8/2011 | Wu |
| 7,998,655 B2 | 8/2011 | Tsubaki |
| 8,017,304 B2 | 9/2011 | Tarutani et al. |
| 8,071,272 B2 | 12/2011 | Tsubaki |
| 8,088,548 B2 | 1/2012 | Houlihan et al. |
| 8,088,557 B2 | 1/2012 | Tsubaki |
| 8,105,748 B2 | 1/2012 | Ohashi et al. |
| 8,257,901 B2 | 9/2012 | Kim et al. |
| 8,323,870 B2 | 12/2012 | Lee et al. |
| 8,329,387 B2 | 12/2012 | Yao et al. |
| 8,334,338 B2 | 12/2012 | Yoshimura et al. |
| 8,445,187 B2 | 5/2013 | Yoon et al. |
| 8,460,856 B2 | 6/2013 | Yeh et al. |
| 8,507,177 B2 | 8/2013 | Wang et al. |
| 8,518,628 B2 | 8/2013 | Chang et al. |
| 8,524,851 B2 | 9/2013 | Kim et al. |
| 8,586,290 B2 | 11/2013 | Wang et al. |
| 8,632,948 B2 | 1/2014 | Padmanaban et al. |
| 9,068,086 B2 | 6/2015 | Evans et al. |
| 9,107,291 B2 * | 8/2015 | Cheng .................. G03F 7/0002 |
| 9,224,841 B2 * | 12/2015 | Harame .......... H01L 21/823481 |
| 9,293,587 B2 * | 3/2016 | Jacob .................. H01L 27/1211 |
| 9,417,528 B2 * | 8/2016 | Shirakawa ............... G03F 7/30 |
| 9,634,091 B2 * | 4/2017 | Ching ............... H01L 29/66439 |
| 9,685,371 B2 * | 6/2017 | Zope ................ H01L 23/53209 |
| 2001/0044070 A1 | 11/2001 | Uetani et al. |
| 2002/0012875 A1 | 1/2002 | Pavelchek et al. |
| 2002/0015826 A1 | 2/2002 | Desmarteau et al. |
| 2002/0051933 A1 | 5/2002 | Kodama et al. |
| 2002/0068237 A1 | 6/2002 | Imai |
| 2002/0111426 A1 | 8/2002 | Dietl et al. |
| 2002/0172896 A1 * | 11/2002 | Adams .................... G03F 7/091 |
| | | 430/322 |
| 2002/0176997 A1 | 11/2002 | Mitra et al. |
| 2002/0195419 A1 | 12/2002 | Pavelchek |
| 2003/0022097 A1 | 1/2003 | Malik et al. |
| 2003/0073027 A1 | 4/2003 | Namiki et al. |
| 2003/0079764 A1 | 5/2003 | Hirose et al. |
| 2003/0087179 A1 | 5/2003 | Iwasaki |
| 2003/0175624 A1 | 9/2003 | Nozaki et al. |
| 2004/0084150 A1 | 5/2004 | George et al. |
| 2004/0096780 A1 | 5/2004 | Nozaki et al. |
| 2004/0161698 A1 | 8/2004 | Kanagasabapathy et al. |
| 2004/0180299 A1 | 9/2004 | Rolland et al. |
| 2005/0134817 A1 | 6/2005 | Nakamura |
| 2005/0145803 A1 | 7/2005 | Hakey et al. |
| 2005/0145821 A1 | 7/2005 | French et al. |
| 2005/0191865 A1 * | 9/2005 | Jacobson .......... H01L 21/31133 |
| | | 438/780 |
| 2005/0225737 A1 | 10/2005 | Weissenrieder et al. |
| 2005/0266354 A1 | 12/2005 | Li et al. |
| 2005/0287466 A1 | 12/2005 | Miyamoto et al. |
| 2006/0008736 A1 | 1/2006 | Kanda et al. |
| 2006/0105267 A1 | 5/2006 | Khojasteh et al. |
| 2006/0141400 A1 | 6/2006 | Hirayama et al. |
| 2006/0204890 A1 | 9/2006 | Kodama |
| 2006/0246373 A1 | 11/2006 | Wang |
| 2006/0257781 A1 | 11/2006 | Benoit et al. |
| 2006/0257785 A1 | 11/2006 | Johnson |
| 2007/0031755 A1 | 2/2007 | Hirayama et al. |
| 2007/0207406 A1 | 9/2007 | Guerrero et al. |
| 2007/0274357 A1 * | 11/2007 | Bazan ................... C08G 61/123 |
| | | 372/43.01 |
| 2008/0073754 A1 * | 3/2008 | Zampini ................. G03F 7/091 |
| | | 257/642 |
| 2008/0113300 A2 | 5/2008 | Choi et al. |
| 2008/0149135 A1 | 6/2008 | Cho et al. |
| 2008/0160729 A1 | 7/2008 | Krueger et al. |
| 2008/0187860 A1 | 8/2008 | Tsubaki et al. |
| 2008/0241778 A1 | 10/2008 | Kulp |
| 2009/0042147 A1 | 2/2009 | Tsubaki |
| 2009/0305163 A1 | 12/2009 | Iwashita et al. |
| 2009/0311624 A1 | 12/2009 | Horiguchi et al. |
| 2010/0040971 A1 | 2/2010 | Tarutani et al. |
| 2010/0075248 A1 | 3/2010 | Mukhopadhyay et al. |
| 2010/0239984 A1 | 9/2010 | Tsubaki |
| 2011/0020755 A1 | 1/2011 | Tsubaki |
| 2011/0097670 A1 | 4/2011 | Wang et al. |
| 2011/0193172 A1 * | 8/2011 | Juengling ............ H01L 27/0886 |
| | | 257/368 |
| 2011/0220994 A1 * | 9/2011 | Parekh .................. H01L 27/108 |
| | | 257/334 |
| 2011/0250543 A1 | 10/2011 | Tsubaki |
| 2011/0263136 A1 | 10/2011 | Kim et al. |
| 2012/0052687 A1 | 3/2012 | Raghavan et al. |

(56) References Cited

U.S. PATENT DOCUMENTS

| | | | |
|---|---|---|---|
| 2012/0088188 A1* | 4/2012 | Trefonas | B81C 1/00031 430/270.1 |
| 2012/0161296 A1 | 6/2012 | Lin et al. | |
| 2012/0171616 A1 | 7/2012 | Thackeray et al. | |
| 2012/0238106 A1 | 9/2012 | Chuang | |
| 2012/0282553 A1 | 11/2012 | Kimura et al. | |
| 2012/0308741 A1 | 12/2012 | Kim et al. | |
| 2012/0308939 A1 | 12/2012 | Kudo et al. | |
| 2013/0187235 A1 | 7/2013 | Huang et al. | |
| 2013/0256759 A1* | 10/2013 | Vellianitis | H01L 29/6681 257/200 |
| 2014/0011133 A1 | 1/2014 | Liu et al. | |
| 2014/0183661 A1* | 7/2014 | Lin | H01L 27/0886 257/401 |
| 2014/0256093 A1* | 9/2014 | Lin | H01L 29/6681 438/157 |
| 2014/0256145 A1* | 9/2014 | Abdallah | H01L 21/0271 438/703 |
| 2014/0264345 A1* | 9/2014 | Tsai | H01L 21/2022 257/52 |
| 2014/0273446 A1* | 9/2014 | Huang | H01L 21/76877 438/669 |
| 2014/0273457 A1* | 9/2014 | Su | C08F 220/18 438/692 |
| 2014/0273506 A1* | 9/2014 | Liu | H01L 21/02345 438/758 |
| 2014/0342292 A1* | 11/2014 | Fu | C08G 77/04 430/325 |
| 2015/0031217 A1* | 1/2015 | Naasani | C09K 11/0811 438/780 |
| 2015/0053928 A1* | 2/2015 | Ching | H01L 27/0924 257/29 |
| 2015/0111384 A1* | 4/2015 | Chang | H01L 29/66795 438/694 |
| 2015/0137308 A1* | 5/2015 | Akarvardar | H01L 21/76229 257/506 |
| 2015/0145083 A1* | 5/2015 | Chou | H01L 27/14636 257/432 |
| 2015/0195916 A1* | 7/2015 | Cheng | H05K 3/007 216/47 |
| 2015/0286771 A1* | 10/2015 | Choi | G03F 1/70 716/51 |
| 2016/0005595 A1* | 1/2016 | Liu | G03F 7/11 438/703 |
| 2016/0013041 A1* | 1/2016 | Liu | G03F 7/40 438/703 |
| 2016/0061997 A1 | 3/2016 | Kamohara et al. | |
| 2017/0194215 A1* | 7/2017 | Ching | H01L 21/823821 |
| 2017/0372892 A1 | 12/2017 | Su et al. | |
| 2018/0090608 A1* | 3/2018 | Yu | H01L 29/785 |

FOREIGN PATENT DOCUMENTS

| | | |
|---|---|---|
| CN | 101880352 A | 11/2010 |
| CN | 102483575 A | 5/2012 |
| EP | 1500977 A1 | 1/2005 |
| JP | 2003084431 A | 3/2003 |
| JP | 2006145788 A | 6/2006 |
| KR | 20010007323 A | 1/2001 |
| KR | 20130085342 A | 7/2013 |
| TW | I336819 B | 2/2011 |
| TW | I341961 B | 5/2011 |
| TW | I343513 B | 6/2011 |
| WO | 2005088397 A2 | 9/2005 |
| WO | 2006054432 A1 | 5/2006 |

OTHER PUBLICATIONS

Kitano, Junichi et al., "Resist pattern collapse prevention for the sub-90nm node," Microlithography World, May 2004, pp. 18-24, PennWell Publishing Corp.

Kunz, Roderick R., Kunz SPIE Short Course, 21 pages, MIT Lincoln Library, 2002, publisher unknown.

Lau, Aldrich N. K. et al., "New Thermal Cross-Linkers Based on Triazene: Cross-Linking of Fluorinated Polyimides and Aromatic Polymers," Macromolecules, vol. 25, 1992, pp. 7294-7299.

Reiser, Arnost, Photoreactive Polymers: The Science and Technology of Resists, Feb. 1989, 409 pages, Wiley-Interscience, New York.

Robertson, Stewart et al., "Physical Resist Simulation for a Negative Tone Development Process," 2010 International Symposium on Lithography Extension, Oct. 20-22, 2010, 19 pages.

Sekiguchi, Atsushi et al., "Analysis of Deprotection Reaction in Chemically Amplified Resists Using an Fourier Transform Infrared Spectrometer with an Exposure Tool," Japan J. Appl. Phys., Mar. 2000, pp. 1392-1398, vol. 39, Part 1, No. 3A.

Switkes, M. et al., "Extending optics to 50 nm and beyond with immersion lithography," Journal of Vacuum Science & Technology B: Microelectronics and Nanometer Structures, Nov./Dec. 2003, vol. 21, No. 6., pp. 2794-2799.

Tarutani, Shinji et al., "Process parameter influence to negative tone development process for double patterning," Proc. SPIE 7639, Advances in Resist Materials and Processing Technology XXVII, Mar. 29, 2010, 13 pages, vol. 7639.

Tsvetanova, D. et al., "Degradation of 248 nm Deep UV Photoresist by Ion Implantation," Journal of The Electromechanical Society, Jun. 10, 2011, 10 pages, vol. 158, Issue 8, The Electromechanical Society.

\* cited by examiner

US 11,094,541 B2

ANTI-REFLECTIVE COATING MATERIALS

PRIORITY CLAIM AND CROSS-REFERENCE

This application is a divisional of and claims priority to U.S. application Ser. No. 16/226,274, filed on Dec. 19, 2018, and entitled "Anti-Reflective Gap Filling Materials and Methods," which is a divisional of and claims priority to U.S. application Ser. No. 15/701,097, filed on Sep. 11, 2017 (now U.S. Pat. No. 10,163,631, issued Dec. 25, 2018), and entitled "Polymer Resin Comprising Gap Filling Materials and Methods," which is a continuation of and claims priority to U.S. application Ser. No. 14/457,902, filed on Aug. 12, 2014 (now U.S. Pat. No. 9,761,449, issued Sep. 12, 2017), and entitled "Gap Filling Materials and Methods," which application claims priority to U.S. Provisional Patent Application No. 61/921,853, filed on Dec. 30, 2013, and entitled "Gap Filling Materials," which applications are incorporated herein by reference.

BACKGROUND

As consumer devices have gotten smaller and smaller in response to consumer demand, the individual components of these devices have necessarily decreased in size as well. Semiconductor devices, which make up a major component of devices such as mobile phones, computer tablets, and the like, have been pressured to become smaller and smaller, with a corresponding pressure on the individual devices (e.g., transistors, resistors, capacitors, etc.) within the semiconductor devices to also be reduced in size.

One enabling technology that is used in the manufacturing processes of semiconductor devices is the use of photolithographic materials. Such materials are applied to a surface and then exposed to an energy that has itself been patterned. Such an exposure modifies the chemical and physical properties of the exposed regions of the photolithographic material. This modification, along with the lack of modification in regions of the photolithographic material that were not exposed, can be exploited to remove one region without removing the other.

However, as the size of individual devices has decreased, process windows for photolithographic processing as become tighter and tighter. As such, advances in the field of photolithographic processing, such as the use of anti-reflective layers to prevent undesired reflections of impinging light, have been necessitated in order to keep up the ability to scale down the devices, and further improvements are needed in order to meet the desired design criteria such that the march towards smaller and smaller components may be maintained.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
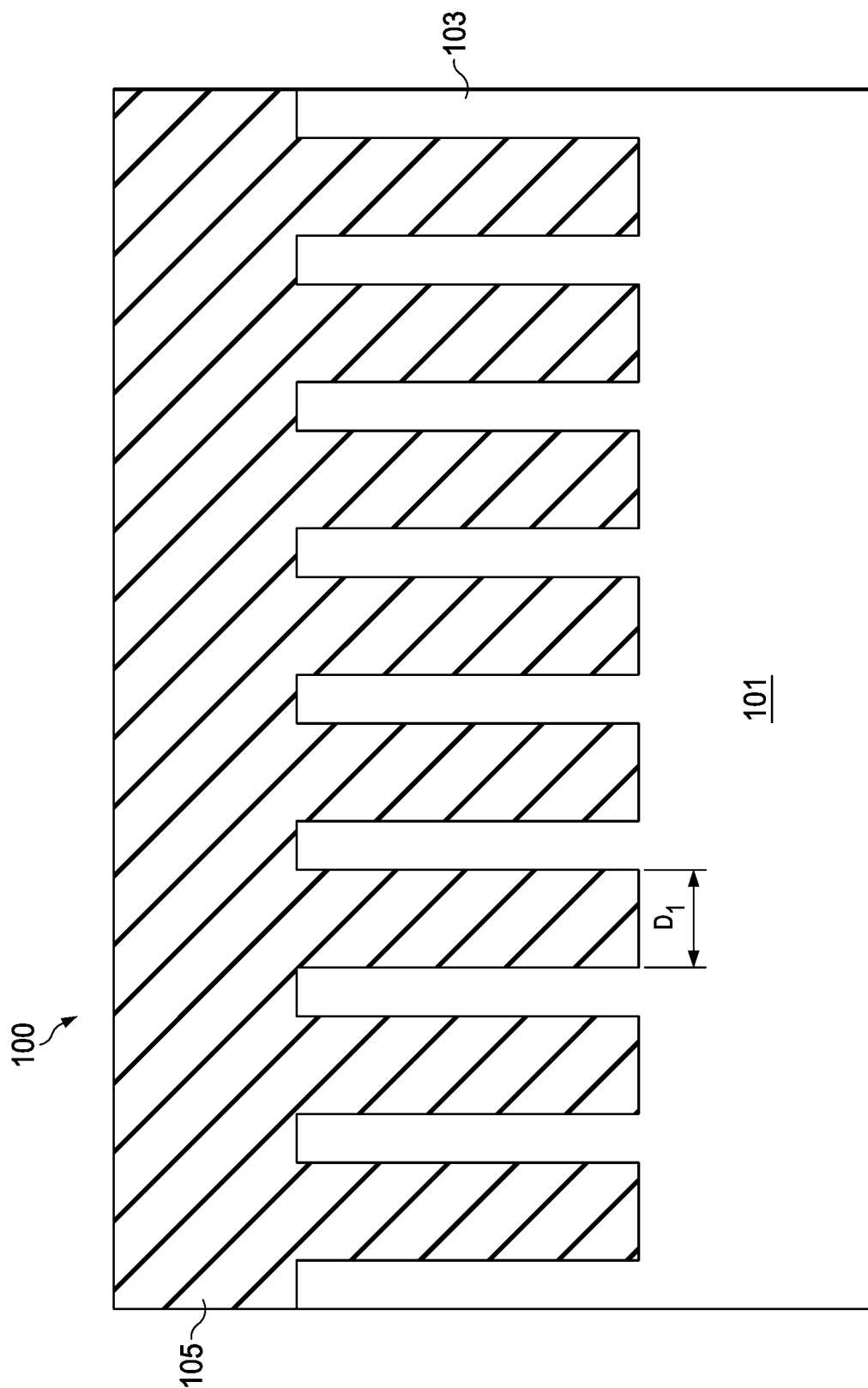
FIG. 1 illustrates a placement of a bottom anti-reflective layer onto a substrate in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

With reference now to FIG. 1, there is shown a semiconductor device 100 with a substrate 101 with fins 103 formed over the substrate 101 and a coating material 105 applied over the fins 103 and the substrate 101. The substrate 101 may comprise bulk silicon, doped or undoped, an active layer of a silicon-on-insulator (SOI) substrate, a metal oxide, a metal nitride, SiN, or the like. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The fins 103 will serve as a fin structure for the eventual formation of FinFET or multiple gate transistors (not separately illustrated in FIG. 1) in, e.g., a 16 nm FinFET process. In an embodiment the fins 103 may be formed from the material of the substrate 101 and, as such, may also comprise bulk silicon, doped or undoped, or be an active layer of a SOI substrate. The fins 103 may be formed by first applying a masking material over the substrate 101, patterning the masking material, and then using the masking material as a mask to etch into the substrate 101, thereby forming the fins 103 from the material of the substrate 101. In an embodiment, the fins 103 may be spaced from each other by a first distance D1 of between about 1 nm and about 100 nm, such as about 20 nm, although any suitable distance, such as less than about 10 nm, may alternatively be utilized.

However, using the material of the substrate 101 to form the fins 103 is only one illustrative method that may be used to form the fins 103. Alternatively, the fins 103 may be formed by initially depositing a semiconductor material, such as silicon, silicon-germanium, or the like, over the substrate 101 and then masking and etching the semiconductor material to form the fins 103 over the substrate 101. In yet another alternative, the fins 103 may be formed by masking the substrate 101 and using, e.g., an epitaxial growth process to grow the fins 103 on the substrate 101. These, and any other suitable method for forming the fins 103 may alternatively be utilized, and all such methods are fully intended to be included within the scope of the embodiments.

Alternatively, the substrate 101 may be a non-semiconductor material and may have different features (e.g., openings instead of the fins 103) formed over the substrate 101. For example, the substrate 101 may be a metal oxide, such as hafnium oxide or aluminum oxide, or a metal nitride, such as titanium nitride or tantalum nitride, with closely spaced features or openings on them. These and all other suitable substrate materials may alternatively be utilized, and all such materials are fully intended to be included within the scope of the embodiments.

The coating material 105 is applied over the fins 103 and fills the regions between the fins 103 in preparation for an application of a photoresist 401 (not illustrated in FIG. 1 but illustrated and described below with respect to FIG. 4). In an embodiment the coating material 105 is a bottom anti-reflective coating layer which, as its name suggests, works to prevent the uncontrolled and undesired reflection of energy (e.g., light) back into the overlying photoresist 401 during an exposure of the photoresist 401, thereby preventing the reflecting light from causing reactions in an undesired region of the photoresist 401. Additionally, the coating material 105 may be used to provide a planar surface over the substrate 101 and the fins 103, helping to reduce the negative effects of the energy impinging at an angle.

However, as one of ordinary skill in the art will recognize, the coating material 105 as a BARC layer is only one illustrative embodiment and is not intended to limit the use of the coating material 105. Rather, the coating material 105 may be used in other capacities, such as for gap-fill, a material to lessen the impacts of a chemical mechanical polish process, an etching process, an implantation process, or even as a photoresist. The coating material 105 may be used for any suitable purpose and all such purposes are fully intended to be included within the scope of the embodiments.

In the embodiment in which the coating material 105 is a BARC layer, the coating material 105 comprises a polymer resin 200, and may optionally comprise a catalyst, and a cross-linking agent. These elements of the coating material 105, prior to dispersal, are placed within a BARC solvent, which allows for an easier dispersal onto the fins 103. Once dispersed within the solvent, the coating material 105 may be baked or UV irradiated (as described below with respect to FIG. 3) in order to drive off the solvent, leaving behind the polymer resin 200, the catalyst, and the cross-linking agent.

Figure 2:
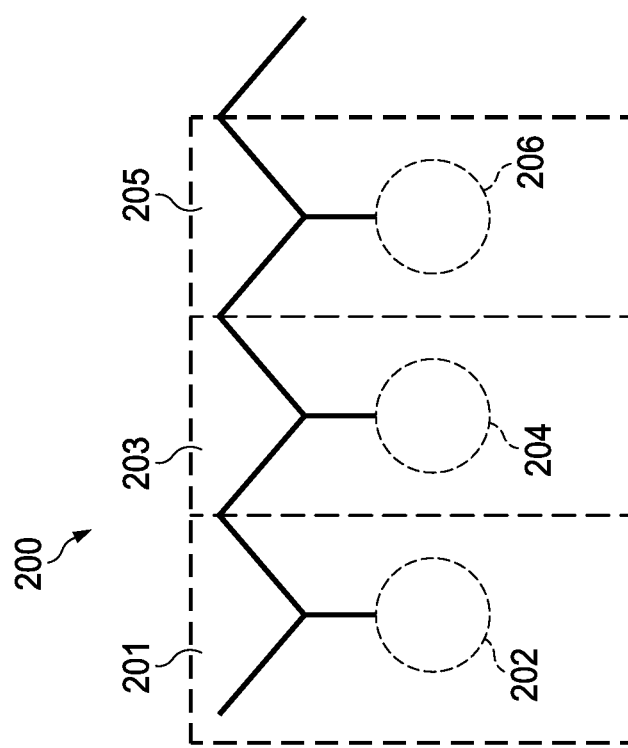
FIG. 2 illustrates a structure for a polymer resin within the bottom anti-reflective layer in accordance with some embodiments.

FIG. 2 illustrates an embodiment of the polymer resin 200 of the coating material 105. In an embodiment the polymer resin 200 comprises a number of repeating units, such as a surface energy modification monomer 201 (with a surface energy modification group 202), an optional chromophore monomer 203 (for when the coating material 105 is used as a BARC layer, with a chromophore group 204), and an optional cross-linking monomer 205 (with a cross-linking group 206). The surface energy modification monomer 201 is utilized to try and match the surface energy of the coating material 105 to the surface energy of the material of the substrate 101 and the fins 103 (e.g., silicon). By matching the surface energies, capillary forces may be used to enhance the gap filling performance of the coating material 105.

In one embodiment the surface energy modification monomer 201 may be used to increase the surface energy of the coating material 105. In such an embodiment, to raise the surface energy of the coating material 105, the surface energy modification group 202 within the surface energy modification monomer 201 comprises one or more of a hydroxyl group, a carboxyl group, an amine group, or an amide group. In a particular embodiment the surface energy modification monomer 201 may have a structure such as the following:

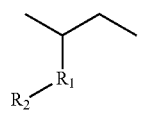

Wherein the $R_1$ and $R_2$ groups collectively form the surface energy modification group 202 and where $R_1$ is an alkyl group with hydrogen attached to the hydrocarbons and wherein $R_1$ may have a straight, branched, or cyclic structure. The alkyl group within $R_1$ may also comprise hetero atoms, such as containing nitrogen or oxygen atoms. $R_2$ may contain at least one of a hydroxyl, carboxyl, amine, or amide group.

In particular embodiments, the surface energy modification monomer 201 may comprise an acrylic acid monomer, a methacrylic acid monomer, a hydrostyrene monomer, or a monomer derived from 2-hydroxyethyl acrylate, some of which have characteristics which allow them to act as the surface energy modification monomer 201, the chromophore monomer 203, and the cross-linking monomer 205. For example, in an embodiment in which the surface energy modification group 202 is a hydrostyrene monomer, the surface energy modification monomer 201 may have the following structure:

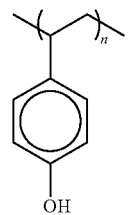

In an embodiment in which the surface energy modification monomer 201 is an acrylic acid monomer, the surface energy modification monomer 201 may have the following structure:

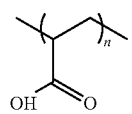

In an embodiment in which the surface energy modification group 202 is a monomer derived from 2-hydroxyethyl acrylate, the surface energy modification monomer 201 may have the following structure:

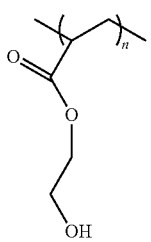

However, as one of ordinary skill in the art will recognize, the precise structures and examples described to raise the surface energy of the coating material 105 are intended to be illustrative and are not intended to be limiting. Rather, any suitable functional group within any suitable monomer that would raise the surface energy of the coating material 105 may alternatively be utilized. These are all fully intended to be included within the scope of the embodiments.

Alternatively, the surface energy modification monomer 201 may be used to decrease the surface energy of the coating material 105. In such an embodiment, to decrease the surface energy of the coating material 105, the surface energy modification group 202 within the surface energy modification monomer 201 comprises one or more of an alkyl group, a fluoro group, or a benzyl group. In particular embodiments, the surface energy modification group 202 may comprise a linear, branched, or cyclic alkyl or fluoro functional group.

In a particular embodiment the surface energy modification monomer 201 may have a structure such as the following:

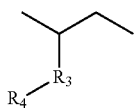

Wherein the $R_3$ and $R_4$ groups collectively form the surface energy modification group 202 and where $R_3$ is an alkyl group with hydrogen attached to the hydrocarbons and wherein $R_3$ may have a straight, branched, or cyclic structure. The alkyl group within $R_3$ may also comprise hetero atoms, such as containing nitrogen or oxygen atoms. However, in this embodiment, $R_4$ may contain at least one of an alkyl, fluoro, or benzyl group, and may comprise a linear, branched, or cyclic alkyl or fluoro group. For example, in some embodiments the polymer resin 200 with the surface energy modification monomer 201 may have the following structures:

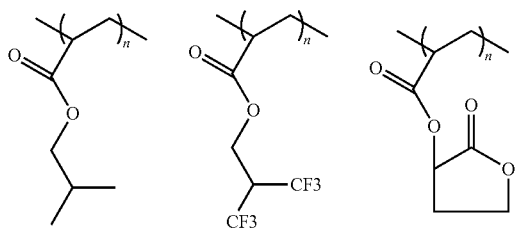

By utilizing the surface energy modification monomer 201, the surface energy of the polymer resin 200 and, as such, the coating material 105 may be modified such that it more closely resembles the surface energy of the substrate 101 and the fins 103. By adjusting the surface energy, the coating material 105, instead of being repelled by the underlying material, will actually be pulled into small openings between structures by capillary forces. This helps the coating material 105 fill such gaps without voids. For example, in an embodiment the surface energy of the polymer resin 200 may be brought to within about 20 dyne/m$^2$ of the surface energy of the underlying material such as the fins 103 or the substrate 101.

In an embodiment the chromophore monomer 203 may comprise chromophore groups 204 such as vinyl compounds containing substituted and unsubstituted phenyl, substituted and unsubstituted anthracyl, substituted and unsubstituted phenanthryl, substituted and unsubstituted naphthyl, substituted and unsubstituted heterocyclic rings containing heteroatoms such as oxygen, nitrogen, sulfur, or combinations thereof, such as pyrrolidinyl, pyranyl, piperidinyl, acridinyl, quinolinyl. The substituents in these units may be any hydrocarbyl group and may further contain heteroatoms, such as, oxygen, nitrogen, sulfur, or combinations thereof, such as alkylenes, ester, ethers, combinations of these, or the like, with a number of carbon atoms between 1 and 12.

In specific embodiments the chromophore group 204 includes styrene, benzene groups, napthalene, groups, anthracene groups, phenanthrene groups, hydroxystyrene, acetoxystyrene, vinyl benzoate, vinyl 4-tert-butylbenzoate, ethylene glycol phenyl ether acrylate, phenoxypropyl acrylate, N-methyl maleimide, 2-(4-benzoyl-3-hydroxyphenoxy)ethyl acrylate, 2-hydroxy-3-phenoxypropyl acrylate, phenyl methacrylate, benzyl methacrylate, 9-anthracenylmethyl methacrylate, 9-vinylanthracene, 2-vinylnaphthalene, N-vinylphthalimide, N-(3-hydroxy)phenyl methacrylamide, N-(3-hydroxy-4-hydroxycarbonylphenylazo)phenyl methacrylamide, N-(3-hydroxyl-4-ethoxycarbonylphenylazo) phenyl methacrylamide, N-(2,4-dinitrophenylamino phenyl) maleimide, 3-(4-acetoaminophenyl)azo-4-hydroxystyrene, 3-(4-ethoxycarbonylphenyl)azo-acetoacetoxy ethyl methacrylate, 3-(4-hydroxyphenyl)azo-acetoacetoxy ethyl methacrylate, tetrahydroammonium sulfate salt of 3-(4-sulfophenyl)azoacetoacetoxy ethyl methacrylate combinations of these, or the like. However, any suitable monomer with chromophore groups 204 to absorb the impinging light and prevent the light from being reflected may alternatively be used, and all such monomers are fully intended to be included within the scope of the embodiments.

In an embodiment in which the chromophore groups 204 comprise benzene, the chromophore groups 204 may have the following structure:

In an embodiment in which the chromophore groups 204 comprise anthracene, the chromophore groups 204 may have the following structure:

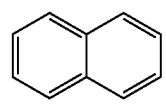

In an embodiment in which the chromophore groups 204 comprise phenanthrene, the chromophore groups 204 may have the following structure:

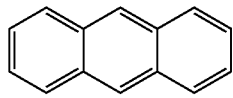 [SMILES: c1ccc2cc3ccccc3cc2c1]

However, these are not the only chromophore groups 203 which may be utilized, as any suitable chromophore group 203, such as the groups described in U.S. Pat. No. 8,445,187 to Yoon et al., entitled "Hardmask Composition Having Antireflective Properties and Method of Patterning Material on Substrate Using the Same," which patent is hereby incorporated herein by reference, may alternatively be used. All such chromophore groups 203 are fully intended to be included within the scope of the embodiments.

The cross-linking monomer 205 may be used to cross-link the monomer with other polymers within the polymer resin 200 to modify the solubility of the coating material 105, and may optionally have an acid labile group. In a particular embodiment the cross-linking monomer 205 may comprise a hydrocarbon chain that also comprises, e.g., a cross-linking group 206 such as a hydroxyl group, a carboxyl acid group, a carboxylic ester group, epoxy groups, urethane groups, amide groups, glycidil ether groups, alkyl oxide groups, alkene groups, alkyne groups, triazene groups, combinations of these, and the like. Specific examples of cross-linking monomers 205 that may be utilized include polyhydroxystyrene, poly(hydroxynaphthalene), poly(metha)crylates, polyarylates, polyesters, polyurethanes, alkyd resins (aliphatic polyesters), poly(hydroxystyrene-methyl-methacrylate), homopolymers and/or copolymers obtained by polymerization of at least one of the following monomers: styrene, hydroxystyrene, hydroxyethyl(meth)acrylate, hydroxypropyl(meth)acrylate, methyl (meth)acrylate, ethyl (meth)acrylate, (meth)acrylic acid, poly(hydroxystyrene-styrene-methacrylate), poly(hydroxystyrene-styrene-methacrylate), poly(4-hydroxystyrene), and poly(pyromellitic dianhydride-ethylene glycol-propylene oxide).

In a particular embodiment, the cross-linking monomer 205 may have the following structure:

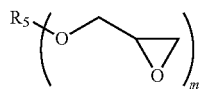

Where $R_5$ comprises an alkyl group with hydrogen attached to the hydrocarbon structure, wherein the alkyl group may have a straight, branched, or cyclic structure. Additionally, alkyl group may also comprise a hetero atom, such as comprising a nitrogen atom or an oxygen or fluorine atom, or even an alkyl fluoride.

In alternative embodiments, the cross-linking monomer 205 may have the following structures:

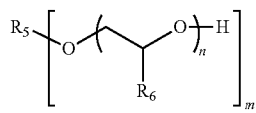

-continued

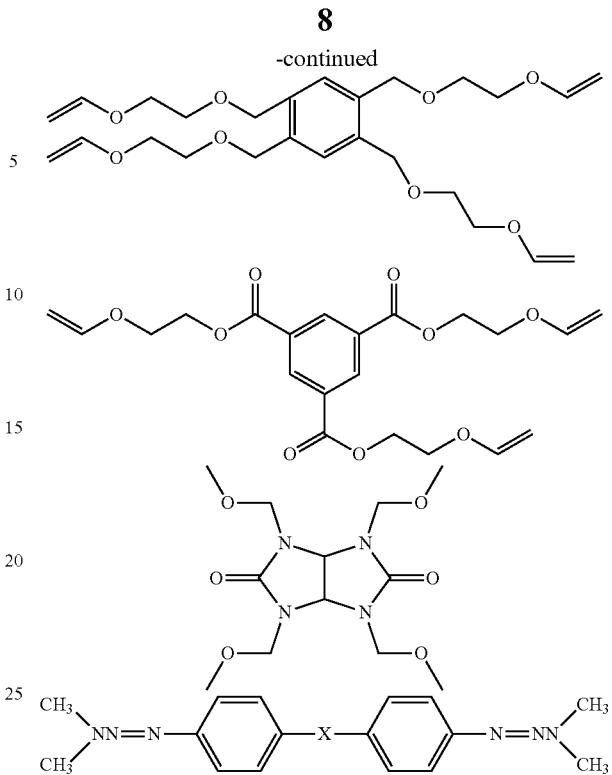

Where $R_5$ is the same as above and wherein $R_6$ represents a hydrogen atom or an alkyl group having 1 to 10 carbon atoms, and where n represents an integer number from 2 to 6, and where X is an optional cross-linking unit or spacer, with between 2 and 8 carbons atoms, such as an alkane unit.

However, these are not the only cross-linking groups 205 which may be utilized, as any suitable cross-linking groups 205, such as the groups described in U.S. Patent Publication No. 2009/0311624 to Horiguchi et al., entitled "Resist Underlayer Film Forming Composition Containing Liquid Additive," U.S. Patent Publication No. 2007/0207406 to Guerrero et al., entitled "Anti-Reflective Coatings Using Vinyl Ether Crosslinkers," and the publication "New Thermal Cross-Linkers Based on Triazene: Cross-Linking of Fluorinated Polyimides and Aromatic Polymers," Lau, Aldrich N. K. and Lanchi P. Vo, *Macromolecules* 1992, 25, 7294-7299, which publications are all hereby incorporated herein by reference, may alternatively be used. All such cross-linking groups 205 are fully intended to be included within the scope of the embodiments.

Additionally, as one of ordinary skill in the art will recognize, the above description for the various monomers that may be polymerized to form the polymer resin 200 for the coating material 105 are intended to be illustrative and are not intended to limit the embodiments in any fashion. Rather, any suitable monomer or combination of monomers that perform the desired functions of the monomers described herein may also be utilized. All such monomers are fully intended to be included within the scope of the embodiments.

In an embodiment the surface energy modification monomer 201 may have a loading within the polymer resin 200 of between about 1% and about 100%, such as about 90%. Also, the chromophore monomer 203 may have a loading within the polymer resin 200 of between about 0% and about 100% (such as when the surface energy modification monomer 201 can also act as the chromophore monomer 203), such as about 5%, and the cross-linking monomer 205 may have a loading of between about 0% and about 100% (such as when the surface energy modification monomer 201 can also act as the cross-linking monomer 205), such as about 5%. However, these descriptions are intended to be illustrative as any suitable loading between the various monomers of the polymer resin 200 may be used, and all such loadings are fully intended to be included within the scope of the embodiments.

The catalyst may be a compound that is used to generate a chemically active species and initiate a cross-linking reaction between the polymers within the polymer resin 200 and may be, e.g., thermal acid generator, a photoacid generator, or a photobase generator, suitable combinations of these, or the like. In an embodiment in which the catalyst is a thermal acid generator, the catalyst will generate an acid when sufficient heat is applied to the coating material 105. Specific examples of the thermal acid generator include butane sulfonic acid, triflic acid, nanoflurobutane sulfonic acid, nitrobenzyl tosylates, such as 2-nitrobenzyl tosylate, 2,4-dinitrobenzyl tosylate, 2,6-dinitrobenzyl tosylate, 4-nitrobenzyl tosylate; benzenesulfonates such as 2-trifluoromethyl-6-nitrobenzyl 4-chlorobenzenesulfonate, 2-trifluoromethyl-6-nitrobenzyl 4-nitro benzenesulfonate; phenolic sulfonate esters such as phenyl, 4-methoxybenzenesulfonate; alkyl ammonium salts of organic acids, such as triethylammonium salt of 10-camphorsulfonic acid, combinations of these, or the like.

In an embodiment in which the catalyst is a photoacid generator, the catalyst may comprise halogenated triazines, onium salts, diazonium salts, aromatic diazonium salts, phosphonium salts, sulfonium salts, iodonium salts, imide sulfonate, oxime sulfonate, diazodisulfone, disulfone, o-nitrobenzylsulfonate, sulfonated esters, halogenerated sulfonyloxy dicarboximides, diazodisulfones, α-cyanooxyaminesulfonates, imidesulfonates, ketodiazosulfones, sulfonyldiazoesters, 1,2-di(arylsulfonyl)hydrazines, nitrobenzyl esters, and the s-triazine derivatives, suitable combinations of these, and the like.

Specific examples of photoacid generators that may be used include α-(trifluoromethylsulfonyloxy)-bicyclo[2.2.1]hept-5-ene-2,3-dicarbo-ximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium and diaryliodonium hexafluoroantimonates, hexafluoroarsenates, trifluoromethanesulfonates, iodonium perfluorooctanesulfonate, N-camphorsulfonyloxynaphthalimide, N-pentafluorophenylsulfonyloxynaphthalimide, ionic iodonium sulfonates such as diaryl iodonium (alkyl or aryl) sulfonate and bis-(di-t-butylphenyl)iodonium camphanylsulfonate, perfluoroalkanesulfonates such as perfluoropentanesulfonate, perfluorooctanesulfonate, perfluoromethanesulfonate, aryl (e.g., phenyl or benzyl) triflates such as triphenylsulfonium triflate or bis-(t-butylphenyl)iodonium triflate; pyrogallol derivatives (e.g., trimesylate of pyrogallol), trifluoromethanesulfonate esters of hydroxyimides, α,α'-bis-sulfonyl-diazomethanes, sulfonate esters of nitro-substituted benzyl alcohols, naphthoquinone-4-diazides, alkyl disulfones, and the like.

In other embodiments the catalyst may be a photobase generator. In such an embodiment the photobase generator may comprise quaternary ammonium dithiocarbamates, α-aminoketones, oxime-urethane containing molecules such as dibenzophenoneoxime hexamethylene diurethan, ammonium tetraorganylborate salts, and N-(2-nitrobenzyloxycarbonyl) cyclic amines, suitable combinations of these, or the like.

In specific embodiments the catalyst may utilize an amine, which will quench the acidity of, e.g., an acid functional group. As such, the acid will be generated by a removal of the amine, such as by evaporation of the amine during, e.g., a baking process (see, e.g., FIG. 3 below). In this embodiment the catalyst may have the following structures:

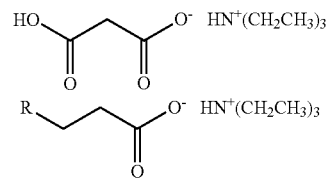

However, these are not the only catalyst which may be utilized, as any suitable catalyst, such as the catalyst described in U.S. Pat. No. 8,088,548 to Houlihan et al., entitled "Bottom Antireflective Coating Compositions," which patent is hereby incorporated herein by reference, may alternatively be used. All such catalyst are fully intended to be included within the scope of the embodiments.

The cross-linking agent may also be added to the coating material 105. The cross-linking agent reacts with the polymers within the polymer resin 200 within the coating material 105 after exposure, assisting in increasing the cross-linking density of the photoresist, which helps to improve the resist pattern and resistance to dry etching. In an embodiment the cross-linking agent may be an melamine based agent, a urea based agent, ethylene urea based agent, propylene urea based agent, glycoluril based agent, an aliphatic cyclic hydrocarbon having a hydroxyl group, a hydroxyalkyl group, or a combination of these, oxygen containing derivatives of the aliphatic cyclic hydrocarbon, glycoluril compounds, etherified amino resins, a polyether polyol, a polyglycidil ether, a vinyl ether, a triazine, an alkene, and alkyne, combinations of these, or the like.

Specific examples of materials that may be utilized as a cross-linking agent include melamine, acetoguanamine, benzoguanamine, urea, ethylene urea, or glycoluril with formaldehyde, glycoluril with a combination of formaldehyde and a lower alcohol, hexamethoxymethylmelamine, bismethoxymethylurea, bismethoxymethylbismethoxyethylene urea, tetramethoxymethylglycoluril, and tetrabutoxymethylglycoluril, mono-, di-, tri-, or tetra-hydroxymethylated glycoluril, mono-, di-, tri-, and/or tetra-methoxymethylated glycoluril, mono-, di-, tri-, and/or tetra-ethoxymethylated glycoluril, mono-, di-, tri-, and/or tetra-propoxymethylated glycoluril, and mono-, di-, tri-, and/or tetra-butoxymethylated glycoluril, 2,3-dihydroxy-5-hydroxymethylnorbornane, 2-hydroxy-5,6-bis(hydroxymethyl)norbornane, cyclohexanedimethanol, 3,4,8(or 9)-trihydroxytricyclodecane, 2-methyl-2-adamantanol, 1,4-dioxane-2,3-diol and 1,3,5-trihydroxycyclohexane, tetramethoxymethyl glycoluril, methylpropyltetramethoxymethyl glycoluril, and methylphenyltetramethoxymethylglycoluril, 2,6-bis(hydroxymethyl)p-cresol, N-methoxymethyl- or N-butoxymethyl-melamine. Additionally, compounds obtained by reacting formaldehyde, or formaldehyde and lower alcohols with amino group-containing compounds, such as melamine, acetoguanamine, benzoguanamine, urea, ethylene urea and glycoluril, and substituting the hydrogen atoms of the amino group with hydroxymethyl group or lower alkoxymethyl group, examples being hexamethoxymethylmelamine, bismethoxymethyl urea, bismethoxymethylbismethoxyethylene urea, tetramethoxymethyl glycoluril and tetrabutoxymethyl glycoluril, copolymers of 3-chloro-2-hydroxypropyl methacrylate and methacrylic acid, copolymers of 3-chloro-2-hydroxypropyl methacrylate and cyclohexyl methacrylate and methacrylic acid, copolymers of 3-chloro-2-hydroxypropyl methacrylate and benzyl methacrylate and methacrylic acid, bisphenol A-di(3-chloro-2-hydroxypropyl) ether, poly(3-chloro-2-hydroxypro-pyl)ether of a phenol novolak resin, pentaerythritol tetra(3-chloro-2-hydroxypropyl)ether, trimethylolmethane tri(3-chloro-2-hydroxypropyl)ether phenol, bisphenol A-di(3-acetoxy-2-hydroxypropyl)ether, poly(3-acetoxy-2-hydroxypropyl)ether of a phenol novolak resin, pentaerythritol tetra(3-acetoxy-2-hydroxypropyl)ether, pentaerythritol poly(3-chloroacetoxy-2-hydroxypropyl)ether, trimethylolmethane tri(3-acetoxy-2-hydroxypropyl)ether, combinations of these, or the like.

Additionally, as one of ordinary skill in the art will recognize, the precise examples listed above regarding the structures and groups that may be used within the polymer resin 200, the catalyst, and the cross-linking agent are merely intended to be illustrative and are not intended to list every possible structure or groups that may be utilized to form the polymer resin 200, the catalyst, and the cross-linking agent. Any suitable alternative structures and any suitable alternative groups may be used to form the polymer resin 200, the catalyst, and the cross-linking agent, and all such structures and groups are fully intended to be included within the scope of the embodiments.

The individual components of the coating material 105 may be placed into the BARC solvent in order to aid in the mixing and placement of the coating material 105. To aid in the mixing and placement of the coating material 105, the solvent is chosen at least in part based upon the materials and monomers chosen for the polymer resin 200 of the coating material 105 as well as the catalyst and the cross-linking agent. In particular, the BARC solvent is chosen such that the polymer resin 200, the catalyst, and the cross-linking agent can be evenly dissolved into the BARC solvent and dispensed upon the substrate 101 and the fins 103.

In an embodiment the BARC solvent may be an organic solvent, and may comprise any suitable solvent such as ketones, alcohols, polyalcohols, ethers, glycol ethers, cyclic ethers, aromatic hydrocarbons, esters, propionates, lactates, lactic esters, alkylene glycol monoalkyl ethers, alkyl lactates, alkyl alkoxypropionates, cyclic lactones, monoketone compounds that contain a ring, alkylene carbonates, alkyl alkoxyacetate, alkyl pyruvates, lactate esters, ethylene glycol alkyl ether acetates, diethylene glycols, propylene glycol alkyl ether acetates, alkylene glycol alkyl ether esters, alkylene glycol monoalkyl esters, or the like.

Specific examples of materials that may be used as the BARC solvent include, acetone, methanol, ethanol, toluene, xylene, propylene glycol ethyl ether (PGEE), methyl isobutyl carbinol (MIBC), isopropyl alcohol (IPA), methyl n-amyl ketone (MAK), ethyl lactate (EL), 4-hydroxy-4-methyl-2-pentanone, tetrahydrofuran, methyl ethyl ketone, cyclohexanone, methyl isoamyl ketone, 2-heptanone, ethylene glycol, ethylene glycol monoacetate, ethylene glycol dimethyl ether, ethylene glycol diethyl ether, ethylene glycol methylethyl ether, ethylene glycol monoetheryl ether, methyl celluslve acetate, ethyl cellosolve acetate, diethylene glycol, diethylene glycol monoacetate, diethylene glycol monomethyl ether, diethylene glycol diethyl ether, diethylene glycol dimethyl ether, diethylene glycol ethylmethyl ether, dietherylene glycol monoethyl ether, diethylene glycol monbutyl ether, ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-2-methylbutanate, methyl 3-methoxypropionate, ethyl 3-methoxypropionate, methyl 3-ethoxypropionate, ethyl 3-ethoxypropionate, ethyl acetate, n-butyl acetate, methyl lactate and ethyl lactate, propylene glycol, propylene glycol monoacetate, propylene glycol monoethyl ether acetate, propylene glycol monomethyl ether acetate, propylene glycol monopropyl methyl ether acetate, propylene glycol monobutyl ether acetate, propylene glycol monobutyl ether acetate, propylene glycol monomethyl ether propionate, propylene glycol monoethyl ether propionate, proplyelen glycol methyl ether adcetate, proplylene glycol ethyl ether acetate, ethylene glycol monomethyl ether acetate, ethylene glycol monoethyl ether acetate, propylene glycol monomethyl ether, propylene glycol monoethyl ether, propylene glycol monopropyl ether, propylene glycol monobutyl ether, ethylene glycol monomethyl ether, ethylene glycol monoethyl ether, methyl lactate, ethyl lactate, propyl lactate, and butyl lactate, ethyl 3-ethoxypropionate, methyl 3-methoxypropionate, methyl 3-ethoxypropionate, and ethyl 3-methoxypropionate, β-propiolactone, β-butyrolactone, γ-butyrolactone, α-methyl-γ-butyrolactone, β-methyl-γ-butyrolactone, γ-valerolactone, γ-caprolactone, γ-octanoic lactone, α-hydroxy-γ-butyrolactone, 2-butanone, 3-methylbutanone, pinacolone, 2-pentanone, 3-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexene-2-one, 3-pentene-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, 3-methylcycloheptanone, pylene carbonate, vinylene carbonate, ethylene carbonate, and butylene carbonate, acetate-2-methoxyethyl, acetate-2-ethoxyethyl, acetate-2-(2-ethoxyethoxy)ethyl, acetate-3-methoxy-3-methylbutyl, acetate-1-methoxy-2-propyl, dipropylene glycol, monomethylether, monoethylether, monopropylether, monobutylehter, monopheylether, dipropylene glycol monoacetate, dioxane, methyl lactate, etheyl lactate, methyl acetate, ethyl acetate, butyl acetate, methyl puruvate, ethyl puruvate, propyl pyruvate, methyl methoxypropionate, ethyl ethoxypropionate, n-methylpyrrolidone (NMP), 2-methoxyethyl ether (diglyme), ethylene glycol monom-ethyl ether, propylene glycol monomethyl ether; ethyl lactate or methyl lactate, methyl proponiate, ethyl proponiate and ethyl ethoxy proponiate, methylethyl ketone, cyclohexanone, 2-heptanone, carbon dioxide, cyclopentatone, cyclohexanone, ethyl 3-ethocypropionate, ethyl lactate, propylene glycol methyl ether acetate (PGMEA), methylene cellosolve, butyle acetate, and 2-ethoxyethanol, N-methylformamide, N,N-dimethylformamide, N-methylformanilide, N-methylacetamide, N,N-dimethylacetamide, N-methylpyrrolidone, dimethylsulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, phenyl cellosolve acetate, or the like.

However, as one of ordinary skill in the art will recognize, the materials listed and described above as examples of materials that may be utilized for the solvent component of the coating material 105 are merely illustrative and are not intended to limit the embodiments. Rather, any suitable material that may dissolve the polymer resin 200, the catalyst, and the cross-linking agent may alternatively be utilized to help mix and apply the coating material 105. All such materials are fully intended to be included within the scope of the embodiments.

Additionally, other components may also be added into the material for the coating material 105 if desired. For example, in an embodiment monomeric dyes, surface leveling agents, adhesion promoters, anti-foaming agent, and the like, may alternatively be utilized. Any suitable additive may be added into the material for the coating material 105, and all such additives are fully intended to be included within the scope of the embodiments.

In an embodiment the polymer resin 200, the catalyst, and the cross-linking agent, along with any desired additives or other agents, are added to the BARC solvent to form the material for the coating material 105. The polymer resin 200 may have a concentration of between about 0.1% and about 30%, such as about 10%, the catalyst may have a concentration of between about 0.1% and about 30%, such as about 5%, and the cross-linking agent may have a concentration of between about 10% and about 20%, such as about 5%.

Once added, the mixture is then mixed in order to achieve an even and constant composition throughout the material for the coating material 105 in order to ensure that there are no defects caused by an uneven mixing or non-constant composition of the material for the coating material 105. Once mixed together, the material for the coating material 105 may either be stored prior to its usage or else used immediately.

Returning now to FIG. 1, once the material for the coating material 105 has been prepared, the material for the coating material 105 may be utilized by initially applying the material for the coating material 105 onto the substrate 101 and the fins 103. The material for the coating material 105 may be applied to the substrate 101 and the fins 103 so that the material for the coating material 105 coats an upper exposed surface of the substrate 101 and the fins 103, and may be applied using a process such as a spin-on coating process, a dip coating method, an air-knife coating method, a curtain coating method, a wire-bar coating method, a gravure coating method, a lamination method, an extrusion coating method, combinations of these, or the like. In an embodiment the material for the coating material 105 may be applied such that it has a thickness over a top of the fins 103 of between about 10 nm and about 1 μm, such as about 300 nm.

Additionally, by matching the surface energy of the polymer resin 200 within the coating material 105 to the material of the underlying structure (e.g., the fins 103 made from silicon), capillary action may be used to pull the polymer resin 200 into the openings and better fill the openings between structures in the underlying material (e.g., the openings between the fins 103). As such, a more uniform fill may be achieved, and voids or bubbles may be reduced or eliminated. Additionally, if any bubbles are formed, their size may be kept to a minimum, such as by being kept below about 5 nm.

Figure 3:
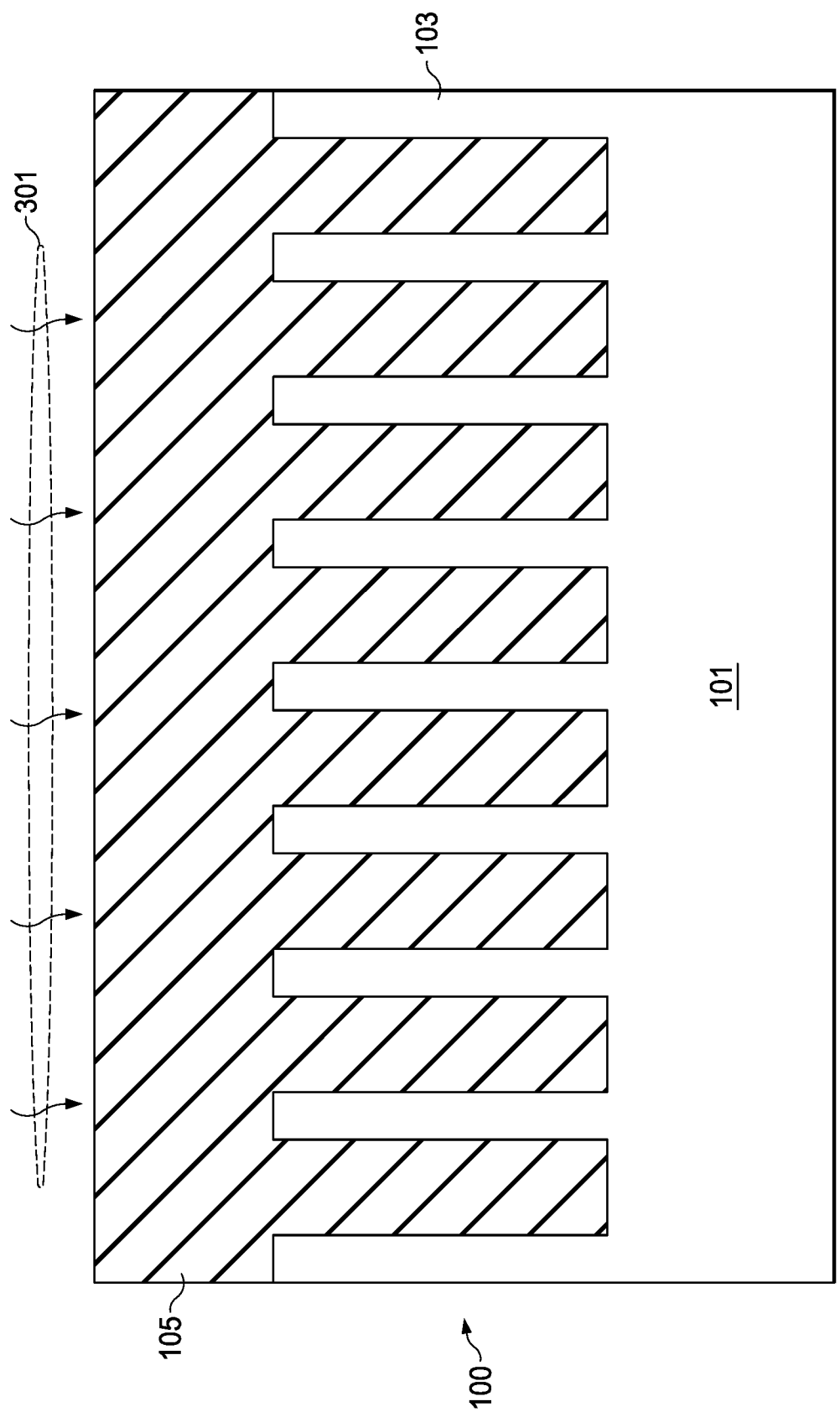
FIG. 3 illustrates a bake of the bottom anti-reflective coating layer in accordance with some embodiments.

FIG. 3 illustrates a pre-bake of the coating material 105 (represented in FIG. 3 by the wavy lines labeled 301). In an embodiment once the coating material 105 has been applied to the substrate 101 and the fins 103, the pre-bake 301 of the coating material 105 is performed in order to initiate a cross-linking reaction between the polymers within the polymer resin 200 and the cross-linking agent as well as to dry the coating material 105 prior to the application of the photoresist 401. The curing and drying of the coating material 105 removes a portion of the BARC solvent components but leaves behind the polymers, the catalysts, the cross-linking agent, and other additives. In an embodiment the pre-bake 301 may be performed at a temperature suitable to evaporate the BARC solvent and initiate the cross-linking reaction, such as between about 70° C. and 300° C., although the precise temperature depends upon the materials chosen for the coating material 105. The pre-bake 301 is performed for a time sufficient to cure and dry the coating material 105, such as between about 10 seconds to about 10 minutes, such as about 90 seconds.

Figure 4:
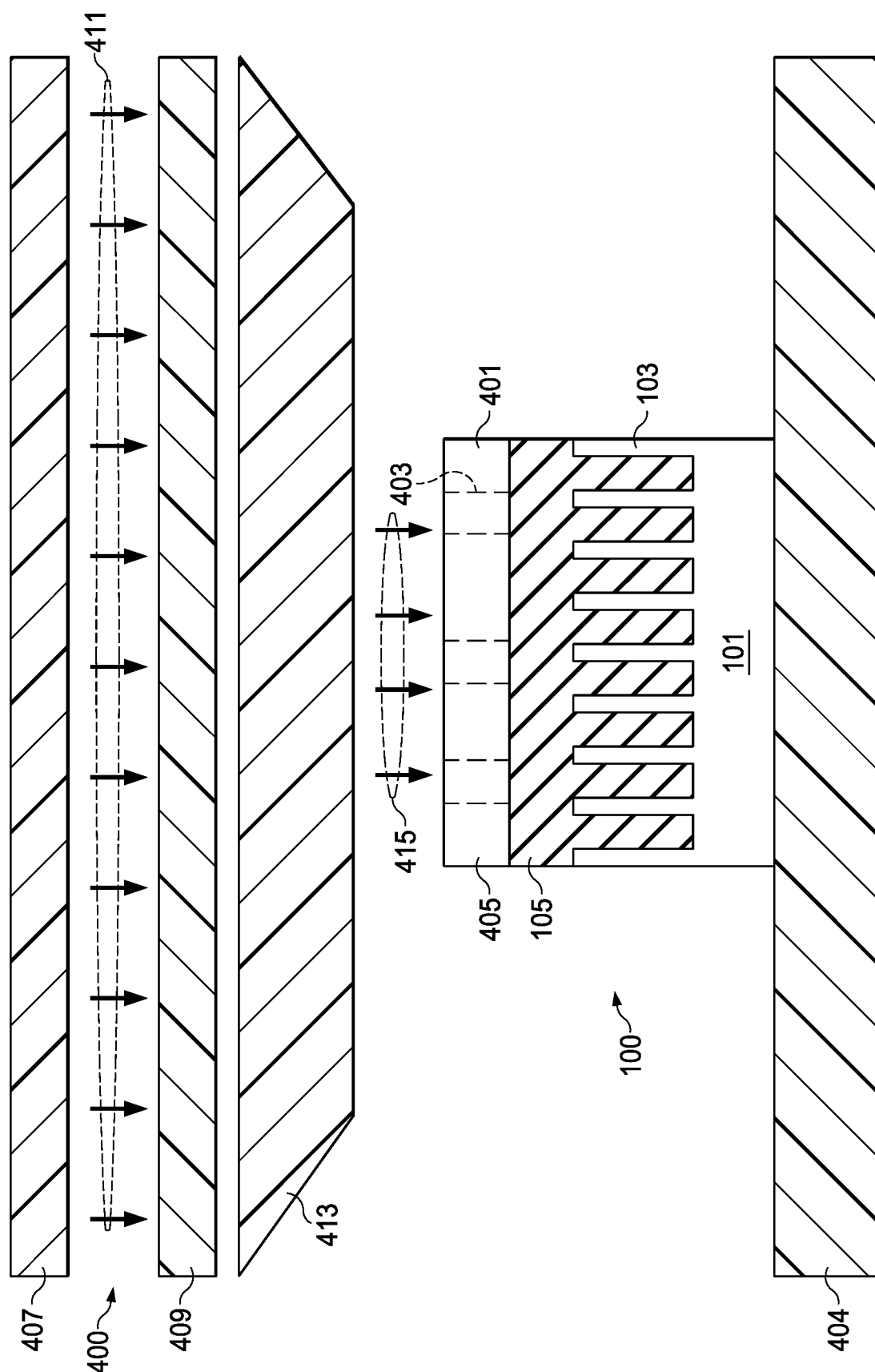
FIG. 4 illustrates a placement and exposure of a photoresist onto the bottom anti-reflective layer in accordance with some embodiments.
Figure 5:
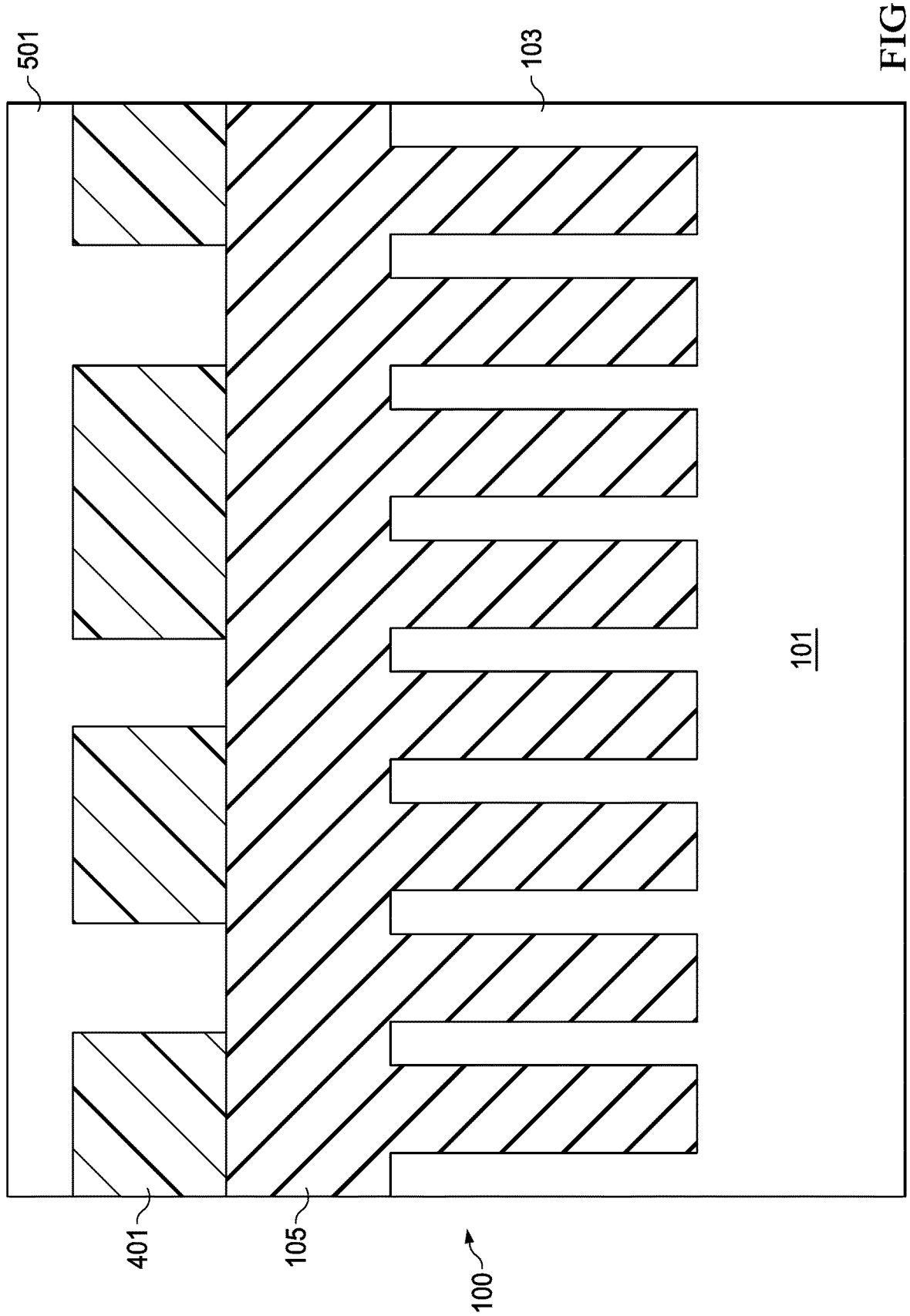
FIG. 5 illustrates a development of the photoresist in accordance with some embodiments.

FIGS. 4-5 illustrate an application, exposure, and development of a photoresist 401 over the coating material 105. In an embodiment the photoresist 401 includes a photoresist polymer resin along with one or more photoactive compounds (PACs) in a photoresist solvent. In an embodiment the photoresist polymer resin may comprise a hydrocarbon structure (such as an alicyclic hydrocarbon structure) that contains one or more groups that will decompose (e.g., acid labile groups) or otherwise react when mixed with acids, bases, or free radicals generated by the PACs (as further described below). In an embodiment the hydrocarbon structure comprises a repeating unit that forms a skeletal backbone of the photoresist polymer resin. This repeating unit may include acrylic esters, methacrylic esters, crotonic esters, vinyl esters, maleic diesters, fumaric diesters, itaconic diesters, (meth)acrylonitrile, (meth)acrylamides, styrenes, vinyl ethers, combinations of these, or the like.

Specific structures which may be utilized for the repeating unit of the hydrocarbon structure include methyl acrylate, ethyl acrylate, n-propyl acrylate, isopropyl acrylate, n-butyl acrylate, isobutyl acrylate, tert-butyl acrylate, n-hexyl acrylate, 2-ethylhexyl acrylate, acetoxyethyl acrylate, phenyl acrylate, 2-hydroxyethyl acrylate, 2-methoxyethyl acrylate, 2-ethoxyethyl acrylate, 2-(2-methoxyethoxy)ethyl acrylate, cyclohexyl acrylate, benzyl acrylate, 2-alkyl-2-adamantyl (meth)acrylate or dialkyl(1-adamantyl)methyl (meth)acrylate, methyl methacrylate, ethyl methacrylate, n-propyl methacrylate, isopropyl methacrylate, n-butyl methacrylate, isobutyl methacrylate, tert-butyl methacrylate, n-hexyl methacrylate, 2-ethylhexyl methacrylate, acetoxyethyl methacrylate, phenyl methacrylate, 2-hydroxyethyl methacrylate, 2-methoxyethyl methacrylate, 2-ethoxyethyl methacrylate, 2-(2-methoxyethoxy)ethyl methacrylate, cyclohexyl methacrylate, benzyl methacrylate, 3-chloro-2-hydroxypropyl methacrylate, 3-acetoxy-2-hydroxypropyl methacrylate, 3-chloroacetoxy-2-hydroxypropyl methacrylate, butyl crotonate, hexyl crotonate and the like. Examples of the vinyl esters include vinyl acetate, vinyl propionate, vinyl butylate, vinyl methoxyacetate, vinyl benzoate, dimethyl maleate, diethyl maleate, dibutyl maleate, dimethyl fumarate, diethyl fumarate, dibutyl fumarate, dimethyl itaconate, diethyl itaconate, dibutyl itaconate, acrylamide, methyl acrylamide, ethyl acrylamide, propyl acrylamide, n-butyl acrylamide, tert-butyl acrylamide, cyclohexyl acrylamide, 2-methoxyethyl acrylamide, dimethyl acrylamide, diethyl acrylamide, phenyl acrylamide, benzyl acrylamide, methacrylamide, methyl methacrylamide, ethyl methacrylamide, propyl methacrylamide, n-butyl methacrylamide, tert-butyl methacrylamide, cyclohexyl methacrylamide, 2-methoxyethyl methacrylamide, dimethyl methacrylamide, diethyl methacrylamide, phenyl methacrylamide, benzyl methacrylamide, methyl vinyl ether, butyl vinyl ether, hexyl vinyl ether, methoxyethyl vinyl ether, dimethylaminoethyl vinyl ether and the like. Examples of the styrenes include styrene, methyl styrene, dimethyl styrene, trimethyl styrene, ethyl styrene, isopropyl styrene, butyl styrene, methoxy styrene, butoxy styrene, acetoxy styrene, chloro styrene, dichloro styrene, bromo styrene, vinyl methyl benzoate, α-methyl styrene, maleimide, vinylpyridine, vinylpyrrolidone, vinylcarbazole, combinations of these, or the like.

In an embodiment the repeating unit of the hydrocarbon structure may also have either a monocyclic or a polycyclic hydrocarbon structure substituted into it, or else the monocyclic or polycyclic hydrocarbon structure may be the repeating unit, in order to form an alicyclic hydrocarbon structure. Specific examples of monocyclic structures that may be used include bicycloalkane, tricycloalkane, tetracycloalkane, cyclopentane, cyclohexane, or the like. Specific examples of polycyclic structures that may be used include adamantine, norbornane, isobornane, tricyclodecane, tetracycododecane, or the like.

The group which will decompose, otherwise known as a leaving group or, in an embodiment in which the PAC is a photoacid generator, an acid labile group, is attached to the hydrocarbon structure so that it will react with the acids/bases/free radicals generated by the PACs during exposure. In an embodiment the group which will decompose may be a carboxylic acid group, a fluorinated alcohol group, a phenolic alcohol group, a sulfonic group, a sulfonamide group, a sulfonylimido group, an (alkylsulfonyl) (alkylcarbonyl)methylene group, an (alkylsulfonyl)(alkyl-carbonyl) imido group, a bis(alkylcarbonyl)methylene group, a bis (alkylcarbonyl)imido group, a bis(alkylsylfonyl)methylene group, a bis(alkylsulfonyl)imido group, a tris(alkylcarbonyl methylene group, a tris(alkylsulfonyl)methylene group, combinations of these, or the like. Specific groups that may be utilized for the fluorinated alcohol group include fluorinated hydroxyalkyl groups, such as a hexafluoroisopropanol group. Specific groups that may be utilized for the carboxylic acid group include acrylic acid groups, methacrylic acid groups, or the like.

In an embodiment the photoresist polymer resin may also comprise other groups attached to the hydrocarbon structure that help to improve a variety of properties of the polymerizable resin. For example, inclusion of a lactone group to the hydrocarbon structure assists to reduce the amount of line edge roughness after the photoresist 401 has been developed, thereby helping to reduce the number of defects that occur during development. In an embodiment the lactone groups may include rings having five to seven members, although any suitable lactone structure may alternatively be used for the lactone group.

The photoresist polymer resin may also comprise groups that can assist in increasing the adhesiveness of the photoresist 401 to underlying structures (e.g., the coating material 105). In an embodiment polar groups may be used to help increase the adhesiveness, and polar groups that may be used in this embodiment include hydroxyl groups, cyano groups, or the like, although any suitable polar group may alternatively be utilized.

Optionally, the photoresist polymer resin may further comprise one or more alicyclic hydrocarbon structures that do not also contain a group which will decompose. In an embodiment the hydrocarbon structure that does not contain a group which will decompose may include structures such as 1-adamantyl(meth)acrylate, tricyclodecanyl (meth)acrylate, cyclohexayl (methacrylate), combinations of these, or the like.

Additionally, the photoresist 401 also comprises one or more PACs. The PACs may be photoactive components such as photoacid generators, photobase generators, free-radical generators, or the like, and the PACs may be positive-acting or negative-acting. In an embodiment in which the PACs are a photoacid generator, the PACs may comprise halogenated triazines, onium salts, diazonium salts, aromatic diazonium salts, phosphonium salts, sulfonium salts, iodonium salts, imide sulfonate, oxime sulfonate, diazodisulfone, disulfone, o-nitrobenzylsulfonate, sulfonated esters, halogenerated sulfonyloxy dicarboximides, diazodisulfones, α-cyanooxyamine-sulfonates, imidesulfonates, ketodiazosulfones, sulfonyldiazoesters, 1,2-di(arylsulfonyl)hydrazines, nitrobenzyl esters, and the s-triazine derivatives, suitable combinations of these, and the like.

Specific examples of photoacid generators that may be used include α.-(trifluoromethylsulfonyloxy)-bicyclo[2.2.1] hept-5-ene-2,3-dicarbo-imide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium and diaryliodonium hexafluoroantimonates, hexafluoroarsenates, trifluoromethanesulfonates, iodonium perfluorooctanesulfonate, N-camphorsulfonyloxynaphthalimide, N-pentafluorophenylsulfonyloxynaphthalimide, ionic iodonium sulfonates such as diaryl iodonium (alkyl or aryl) sulfonate and bis-(di-t-butylphenyl)iodonium camphanylsulfonate, perfluoroalkanesulfonates such as perfluoropentanesulfonate, perfluorooctanesulfonate, perfluoromethanesulfonate, aryl (e.g., phenyl or benzyl) triflates such as triphenylsulfonium triflate or bis-(t-butylphenyl)iodonium triflate; pyrogallol derivatives (e.g., trimesylate of pyrogallol), trifluoromethanesulfonate esters of hydroxyimides, α,α'-bis-sulfonyl-diazomethanes, sulfonate esters of nitro-substituted benzyl alcohols, naphthoquinone-4-diazides, alkyl disulfones, and the like.

In an embodiment in which the PACs are a free-radical generator, the PACs may comprise n-phenylglycine, aromatic ketones such as benzophenone, N,N'-tetramethyl-4,4'-diaminobenzophenone, N,N'-tetraethyl-4,4'-diaminobenzophenone, 4-methoxy-4'-dimethylaminobenzophenone, 3,3'-dimethyl-4-methoxybenzophenone, p,p'-bis (dimethylamino)benzophenone, p,p'-bis(diethylamino)-benzophenone, anthraquinone, 2-ethylanthraquinone, naphthaquinone and phenanthraquinone, benzoins such as benzoin, benzoinmethylether, benzoinethylether, benzoinisopropylether, benzoin-n-butylether, benzoin-phenylether, methylbenzoin and ethybenzoin, benzyl derivatives such as dibenzyl, benzyldiphenyldisulfide and benzyldimethylketal, acridine derivatives such as 9-phenylacridine and 1,7-bis(9-acridinyl)heptane, thioxanthones such as 2-chlorothioxanthone, 2-methylthioxanthone, 2,4-diethylthioxanthone, 2,4-dimethylthioxanthone and 2-isopropylthioxanthone, acetophenones such as 1,1-dichloroacetophenone, p-t-butyldichloro-acetophenone, 2,2-diethoxyacetophenone, 2,2-dimethoxy-2-phenylacetophenone, and 2,2-dichloro-4-phenoxyacetophenone, 2,4,5-triarylimidazole dimers such as 2-(o-chlorophenyl)-4,5-diphenylimidazole dimer, 2-(o-chlorophenyl)-4,5-di-(m-methoxyphenyl imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer and 2-(p-methylmercaptophenyl)-4,5-diphenylimidazole dimmer, suitable combinations of these, or the like.

In an embodiment in which the PACs are a photobase generator, the PACs may comprise quaternary ammonium dithiocarbamates, a aminoketones, oxime-urethane containing molecules such as dibenzophenoneoxime hexamethylene diurethan, ammonium tetraorganylborate salts, and N-(2-nitrobenzyloxycarbonyl) cyclic amines, suitable combinations of these, or the like. However, as one of ordinary skill in the art will recognize, the chemical compounds listed herein are merely intended as illustrated examples of the PACs and are not intended to limit the embodiments to only those PACs specifically described. Rather, any suitable PAC may alternatively be utilized, and all such PACs are fully intended to be included within the scope of the present embodiments.

The individual components of the photoresist 401 may be placed into a photoresist solvent in order to aid in the mixing and placement of the photoresist 401. To aid in the mixing and placement of the photoresist 401, the photoresist solvent is chosen at least in part based upon the materials chosen for the photoresist polymer resin as well as the PACs. In particular, the photoresist solvent is chosen such that the photoresist polymer resin and the PACs can be evenly dissolved into the photoresist solvent and dispensed upon the coating material 105.

In an embodiment the photoresist solvent may be an organic solvent, and may comprise any suitable solvent such as ketones, alcohols, polyalcohols, ethers, glycol ethers, cyclic ethers, aromatic hydrocarbons, esters, propionates, lactates, lactic esters, alkylene glycol monoalkyl ethers, alkyl lactates, alkyl alkoxypropionates, cyclic lactones, monoketone compounds that contain a ring, alkylene carbonates, alkyl alkoxyacetate, alkyl pyruvates, lactate esters, ethylene glycol alkyl ether acetates, diethylene glycols, propylene glycol alkyl ether acetates, alkylene glycol alkyl ether esters, alkylene glycol monoalkyl esters, or the like.

Specific examples of materials that may be used as the photoresist solvent for the photoresist 401 include, acetone, methanol, ethanol, toluene, xylene, 4-hydroxy-4-methyl-2-pentatone, tetrahydrofuran, methyl ethyl ketone, cyclohexanone, methyl isoamyl ketone, 2-heptanone, ethylene glycol, ethylene glycol monoacetate, ethylene glycol dimethyl ether, ethylene glycol dimethyl ether, ethylene glycol methylethyl ether, ethylene glycol monoetheryl ether, methyl celluslve acetate, ethyl cellosolve acetate, diethylene glycol, diethylene glycol monoacetate, diethylene glycol monomethyl ether, diethylene glycol diethyl ether, diethylene glycol dimethyl ether, diethylene glycol ethylmethyl ether, dietherylene glycol monoethyl ether, diethylene glycol monbutyl ether, ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-2-methylbutanate, methyl 3-methoxypropionate, ethyl 3-methoxypropionate, methyl 3-ethoxypropionate, ethyl 3-ethoxypropionate, ethyl acetate, butyl acetate, methyl lactate and ethyl lactate, propylene glycol, propylene glycol monoacetate, propylene glycol monoethyl ether acetate, propylene glycol monomethyl ether acetate, propylene glycol monopropyl methyl ether acetate, propylene glycol monobutyl ether acetate, propylene glycol monobutyl ether acetate, propylene glycol monomethyl ether propionate, propylene glycol monoethyl ether propionate, proplyelen glycol methyl ether adcetate, proplylene glycol ethyl ether acetate, ethylene glycol monomethyl ether acetate, ethylene glycol monoethyl ether acetate, propylene glycol monomethyl ether, propylene glycol monoethyl ether, propylene glycol monopropyl ether, propylene glycol monobutyl ether, ethylene glycol monomethyl ether, ethylene glycol monoethyl ether, methyl lactate, ethyl lactate, propyl lactate, and butyl lactate, ethyl 3-ethoxypropionate, methyl 3-methoxypropionate, methyl 3-ethoxypropionate, and ethyl 3-methoxypropionate, β-propiolactone, β-butyrolactone, γ-butyrolactone, α-methyl-γ-butyrolactone, β-methyl-γ-butyrolactone, γ-valerolactone, γ-caprolactone, γ-octanoic lactone, α-hydroxy-γ-butyrolactone, 2-butanone, 3-methylbutanone, pinacolone, 2-pentanone, 3-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexene-2-one, 3-pentene-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, 3-methylcycloheptanone, pylene carbonate, vinylene carbonate, ethylene carbonate, and butylene carbonate, acetate-2-methoxyethyl, acetate-2-ethoxyethyl, acetate-2-(2-ethoxyethoxy)ethyl, acetate-3-methoxy-3-methylbutyl, acetate-1-methoxy-2-propyl, dipropylene glycol, monomethylether, monoethylether, monopropylether, monobutylehter, monopheylether, dipropylene glycol monoacetate, dioxane, methyl lactate, etheyl lactate, methyl acetate, ethyl acetate, butyl acetate, methyl puruvate, ethyl puruvate, propyl pyruvate, methyl methoxypropionate, ethyl ethoxypropionate, n-methylpyrrolidone (NMP), 2-methoxyethyl ether (diglyme), ethylene glycol monom-ethyl ether, propylene glycol monomethyl ether; ethyl lactate or methyl lactate, methyl proponiate, ethyl proponiate and ethyl ethoxy proponiate, methylethyl ketone, cyclohexanone, 2-heptanone, carbon dioxide, cyclopentatone, cyclohexanone, ethyl 3-ethocypropionate, ethyl lactate, propylene glycol methyl ether acetate (PGMEA), methylene cellosolve, butyle acetate, and 2-ethoxyethanol, N-methylformamide, N,N-dimethylformamide, N-methylformanilide, N-methylacetamide, N,N-dimethylacetamide, N-methylpyrrolidone, dimethylsulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, phenyl cellosolve acetate, or the like.

However, as one of ordinary skill in the art will recognize, the materials listed and described above as examples of materials that may be utilized for the photoresist solvent component of the photoresist 401 are merely illustrative and are not intended to limit the embodiments. Rather, any suitable material that may dissolve the photoresist polymer resin and the PACs may alternatively be utilized to help mix and apply the photoresist 401. All such materials are fully intended to be included within the scope of the embodiments.

Additionally, while individual ones of the above-described materials may be used as the photoresist solvent for the photoresist 401, in alternative embodiments more than one of the above-described materials may be utilized. For example, the photoresist solvent may comprise a combination mixture of two or more of the materials described. All such combinations are fully intended to be included within the scope of the embodiments.

Optionally, a photoresist cross-linking agent may also be added to the photoresist 401. The photoresist cross-linking agent reacts with the photoresist polymer resin within the photoresist 401 after exposure, assisting in increasing the cross-linking density of the photoresist, which helps to improve the resist pattern and resistance to dry etching. In an embodiment the photoresist cross-linking agent may be an melamine based agent, a urea based agent, ethylene urea based agent, propylene urea based agent, glycoluril based agent, an aliphatic cyclic hydrocarbon having a hydroxyl group, a hydroxyalkyl group, or a combination of these, oxygen containing derivatives of the aliphatic cyclic hydrocarbon, glycoluril compounds, etherified amino resins, combinations of these, or the like.

Specific examples of materials that may be utilized as a photoresist cross-linking agent include melamine, acetoguanamine, benzoguanamine, urea, ethylene urea, or glycoluril with formaldehyde, glycoluril with a combination of formaldehyde and a lower alcohol, hexamethoxymethylmelamine, bismethoxymethylurea, bismethoxymethylbismethoxyethylene urea, tetramethoxymethylglycoluril, and tetrabutoxymethylglycoluril, mono-, di-, tri-, or tetra-hydroxymethylated glycoluril, mono-, di-, tri-, and/or tetra-methoxymethylated glycoluril, mono-, di-, tri-, and/or tetra-ethoxymethylated glycoluril, mono-, di-, tri-, and/or tetra-propoxymethylated glycoluril, and mono-, di-, tri-, and/or tetra-butoxymethylated glycoluril, 2,3-dihydroxy-5-hydroxymethylnorbornane, 2-hydroxy-5,6-bis(hydroxymethyl)norbornane, cyclohexanedimethanol, 3,4,8(or 9)-trihydroxytricyclodecane, 2-methyl-2-adamantanol, 1,4-dioxane-2,3-diol and 1,3,5-trihydroxycyclohexane, tetramethoxymethyl glycoluril, methylpropyltetramethoxymethyl glycoluril, and methylphenyltetramethoxymethylglycoluril, 2,6-bis(hydroxymethyl)p-cresol, N-methoxymethyl- or N-butoxymethyl-melamine. Additionally, compounds obtained by reacting formaldehyde, or formaldehyde and lower alcohols with amino group-containing compounds, such as melamine, acetoguanamine, benzoguanamine, urea, ethylene urea and glycoluril, and substituting the hydrogen atoms of the amino group with hydroxymethyl group or lower alkoxymethyl group, examples being hexamethoxymethylmelamine, bis-methoxymethyl urea, bismethoxymethylbismethoxyethylene urea, tetramethoxymethyl glycoluril and tetrabutoxymethyl glycoluril, copolymers of 3-chloro-2-hydroxypropyl methacrylate and methacrylic acid, copolymers of 3-chloro-2-hydroxypropyl methacrylate and cyclohexyl methacrylate and methacrylic acid, copolymers of 3-chloro-2-hydroxypropyl methacrylate and benzyl methacrylate and methacrylic acid, bisphenol A-di(3-chloro-2-hydroxypropyl) ether, poly(3-chloro-2-hydroxypropyl)ether of a phenol novolak resin, pentaerythritol tetra(3-chloro-2-hydroxypropyl)ether, trimethylolmethane tri(3-chloro-2-hydroxypropyl)ether phenol, bisphenol A-di(3-acetoxy-2-hydroxypropyl)ether, poly(3-acetoxy-2-hydroxypropyl)ether of a phenol novolak resin, pentaerythritol tetra(3-acetoxy-2-hydroxypropyl)ether, pentaerythritol poly(3-chloroacetoxy-2-hydroxypropyl)ether, trimethylolmethane tri(3-acetoxy-2-hydroxypropyl)ether, combinations of these, or the like.

In addition to the photoresist polymer resin, the PACs, the photoresist solvents, and the photoresist cross-linking agents, the photoresist 401 may also include a number of other additives that will assist the photoresist 401 obtain the highest resolution. For example, the photoresist 401 may also include surfactants in order to help improve the ability of the photoresist 401 to coat the surface on which it is applied. In an embodiment the surfactants may include nonionic surfactants, polymers having fluorinated aliphatic groups, surfactants that contain at least one fluorine atom and/or at least one silicon atom, polyoxyethylene alkyl ethers, polyoxyethylene alkyl aryl ethers, polyoxyethylene-polyoxypropylene block copolymers, sorbitan fatty acid esters, polyoxyethylene sorbitan fatty acid esters.

Specific examples of materials that may be used as surfactants include polyoxyethylene lauryl ether, polyoxyethylene stearyl ether, polyoxyethylene cetyl ether, polyoxyethylene oleyl ether, polyoxyethylene octyl phenol ether, polyoxyethylene nonyl phenol ether, sorbitan monolaurate, sorbitan monopalmitate, sorbitan monostearate, sorbitan monooleate, sorbitan trioleate, sorbitan tristearate, polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, polyethylene glycol distearate, polyethylene glycol dilaurate, polyethylene glycol dilaurate, polyethylene glycol, polypropylene glycol, polyoxyethylenestearyl ether and polyoxyethylene cetyl ether; fluorine containing cationic surfactants, fluorine containing nonionic surfactants, fluorine containing anionic surfactants, cationic surfactants and anionic surfactants, polyethylene glycol, polypropylene glycol, polyoxyethylene cetyl ether, combinations of these, or the like.

Another additive that may be added to the photoresist 401 is a quencher, which may be utilized to inhibit diffusion of the generated acids/bases/free radicals within the photoresist, which helps the resist pattern configuration as well as to improve the stability of the photoresist 401 over time. In an embodiment the quencher is an amine such as a second lower aliphatic amine, a tertiary lower aliphatic amine, or the like. Specific examples of amines that may be used include trimethylamine, diethylamine, triethylamine, di-n-propylamine, tri-n-propylamine, tripentylamine, diethanolamine, and triethanolamine, alkanolamine, combinations of these, or the like.

Alternatively, an organic acid may be utilized as the quencher. Specific embodiments of organic acids that may be utilized include malonic acid, citric acid, malic acid, succinic acid, benzoic acid, salicylic acid, phosphorous oxo acid and its derivatives such as phosphoric acid and derivatives thereof such as its esters, such as phosphoric acid, phosphoric acid di-n-butyl ester and phosphoric acid diphenyl ester; phosphonic acid and derivatives thereof such as its ester, such as phosphonic acid, phosphonic acid dimethyl ester, phosphonic acid di-n-butyl ester, phenylphosphonic acid, phosphonic acid diphenyl ester, and phosphonic acid dibenzyl ester; and phosphinic acid and derivatives thereof such as its esters, including phosphinic acid and phenylphosphinic acid.

Another additive that may be added to the photoresist 401 is a stabilizer, which assists in preventing undesired diffusion of the acids generated during exposure of the photoresist 401. In an embodiment the stabilizer may include nitrogenous compounds such as aliphatic primary, secondary, and tertiary amines, cyclic amines such as piperidines, pyrrolidines, morpholines, aromatic heterocycles such as pyridines, pyrimidines, purines, imines such as diazabicycloundecene, guanidines, imides, amides, and others. Alternatively, ammonium salts may also be used for the stabilizer, including ammonium, primary, secondary, tertiary, and quaternary alkyl- and arylammonium salts of alkoxides including hydroxide, phenolates, carboxylates, aryl and alkyl sulfonates, sulfonamides, and others. Other cationic nitrogenous compounds including pyridinium salts and salts of other heterocyclic nitrogenous compounds with anions such as alkoxides including hydroxide, phenolates, carboxylates, aryl and alkyl sulfonates, sulfonamides, and the like may also be employed.

Yet another additive that may be added to the photoresist 401 may be a dissolution inhibitor in order to help control dissolution of the photoresist 401 during development. In an embodiment bile-salt esters may be utilized as the dissolution inhibitor. Specific examples of materials that may be utilized include cholic acid (IV), deoxycholic acid (V), lithocholic acid (VI), t-butyl deoxycholate (VII), t-butyl lithocholate (VIII), and t-butyl-3-α-acetyl lithocholate (IX).

Another additive that may be added to the photoresist 401 may be a plasticizer. Plasticizers may be used to reduce delamination and cracking between the photoresist 401 and underlying layers (e.g., the coating material 105) and may comprise monomeric, loigomeric, and polymeric plasticizers such as oligo-anpolyethyleneglycol ethers, cycloaliphatic esters, and non-acid reactive steroidally-derived materials. Specific examples of materials that may be used for the plasticizer include dioctyl phthalate, didodecyl phthalate, triethylene glycol dicaprylate, dimethyl glycol phthalate, tricresyl phosphate, dioctyl adipate, dibutyl sebacate, triacetyl glycerine and the like.

Yet another additive that may be added include a coloring agent, which helps observers examine the photoresist 401 and find any defects that may need to be remedied prior to further processing. In an embodiment the coloring agent may be either a triarylmethane dye or, alternatively, may be a fine particle organic pigment. Specific examples of materials that may be used as coloring agents include crystal violet, methyl violet, ethyl violet, oil blue #603, Victoria Pure Blue BOH, malachite green, diamond green, phthalocyanine pigments, azo pigments, carbon black, titanium oxide, brilliant green dye (C. I. 42020), Victoria Pure Blue FGA (Linebrow), Victoria BO (Linebrow) (C. I. 42595), Victoria Blue BO (C. I. 44045) rhodamine 6G (C. I. 45160), Benzophenone compounds such as 2,4-dihydroxybenzophenone and 2,2',4,4'-tetrahydroxybenzophenone, salicylic acid compounds such as phenyl salicylate and 4-t-butylphenyl salicylate, phenylacrylate compounds such as ethyl-2-cyano-3,3-diphenylacrylate, and 2'-ethylhexyl-2-cyano-3,3-diphenylacrylate, benzotriazole compounds such as 2-(2-hydroxy-5-methylphenyl)-2H-benzotriazole, and 2-(3-t-butyl-2-hydroxy-5-methylphenyl)-5-chloro-2H-benzotriazole, coumarin compounds such as 4-methyl-7-diethylamino-1-benzopyran-2-one, thioxanthone compounds such as diethylthioxanthone, stilbene compounds, naphthalic acid compounds, azo dyes, Phthalocyanine blue, phthalocyanine green, iodine green, Victoria blue, crystal violet, titanium oxide, carbon black, naphthalene black, Photopia methyl violet, bromphenol blue and bromcresol green, laser dyes such as Rhodamine G6, Coumarin 500, DCM (4-(dicyanomethylene)-2-methyl-6-(4-dimethylaminostyryl)-4H pyran)), Kiton Red 620, Pyrromethene 580, or the like. Additionally, one or more coloring agents may be used in combination to provide the desired coloring.

Adhesion additives may also be added to the photoresist 401 in order to promote adhesion between the photoresist 401 and an underlying layer upon which the photoresist 401 has been applied (e.g., the coating material 105). In an embodiment the adhesion additives include a silane compound with at least one reactive substituent such as a carboxyl group, a methacryloyl group, an isocyanate group and/or an epoxy group. Specific examples of the adhesion components include trimethoxysilyl benzoic acid, γ-methacryloxypropyl trimethoxy silane, vinyltriacetoxysilane, vinyltrimethoxysilane, γ-isocyanatepropyl triethoxy silane, γ-glycidoxypropyl trimethoxy silane, β-(3,4-epoxycyclohexyl)ethyl trimethoxy silane, benzimidazoles and polybenzimidazoles, a lower hydroxyalkyl substituted pyridine derivative, a nitrogen heterocyclic compound, urea, thiourea, an organophosphorus compound, 8-oxyquinoline, 4-hydroxypteridine and derivatives, 1,10-phenanthroline and derivatives, 2,2'-bipyridine and derivatives, benzotriazoles; organophosphorus compounds, phenylenediamine compounds, 2-amino-1-phenylethanol, N-phenylethanolamine, N-ethyldiethanolamine, N-ethylethanolamine and derivatives, benzothiazole, and a benzothiazoleamine salt having a cyclohexyl ring and a morpholine ring, 3-glycidoxypropyltrimethoxysilane, 3-glycidoxypropyltriethoxysilane, 3-mercaptopropyltrimethoxysilane, 3-mercaptopropyltriethoxysilane, 3-methacryloyloxypropyltrimethoxysilane, vinyl trimethoxysilane, combinations of these, or the like.

Surface leveling agents may additionally be added to the photoresist 401 in order to assist a top surface of the photoresist 401 to be level so that impinging light will not be adversely modified by an unlevel surface. In an embodiment surface leveling agents may include fluoroaliphatic esters, hydroxyl terminated fluorinated polyethers, fluorinated ethylene glycol polymers, silicones, acrylic polymer leveling agents, combinations of these, or the like.

In an embodiment the photoresist polymer resin and the PACs, along with any desired additives or other agents, are added to the photoresist solvent for application. Once added, the mixture is then mixed in order to achieve an even composition throughout the photoresist 401 in order to ensure that there are no defects caused by an uneven mixing or non-constant composition of the photoresist 401. Once mixed together, the photoresist 401 may either be stored prior to its usage or else used immediately.

Once ready, the photoresist 401 may be utilized by initially applying the photoresist 401 onto the coating material 105. The photoresist 401 may be applied to the coating material 105 so that the photoresist 401 coats an upper exposed surface of the coating material 105, and may be applied using a process such as a spin-on coating process, a dip coating method, an air-knife coating method, a curtain coating method, a wire-bar coating method, a gravure coating method, a lamination method, an extrusion coating method, combinations of these, or the like. In an embodiment the photoresist 401 may be applied such that it has a thickness over the surface of the coating material 105 of between about 10 nm and about 300 nm, such as about 150 nm.

Once the photoresist 401 has been applied to the semiconductor substrate, a pre-bake of the photoresist 401 is performed in order to cure and dry the photoresist 401 prior to exposure to finish the application of the photoresist 401. The curing and drying of the photoresist 401 removes the photoresist solvent component while leaving behind the photoresist polymer resin, the PACs, the photoresist cross-linking agents, and the other chosen additives. In an embodiment the pre-bake may be performed at a temperature suitable to evaporate the photoresist solvent, such as between about 40° C. and 150° C., although the precise temperature depends upon the materials chosen for the photoresist 401. The pre-bake is performed for a time sufficient to cure and dry the photoresist 401, such as between about 10 seconds to about 5 minutes, such as about 90 seconds.

Once applied, the photoresist 401 may be exposed to form an exposed region 405 and an unexposed region 403 within the photoresist 401. In an embodiment the exposure may be initiated by placing the substrate 101 and the photoresist 401, once cured and dried, into a photoresist imaging device 400 for exposure. The photoresist imaging device 400 may comprise a photoresist support plate 404, a photoresist energy source 407, a patterned mask 409 between the photoresist support plate 404 and the photoresist energy source 407, and photoresist optics 413. In an embodiment the photoresist support plate 404 is a surface to which the semiconductor device 100 and the photoresist 401 may be placed or attached to and which provides support and control to the substrate 101 during exposure of the photoresist 401. Additionally, the photoresist support plate 404 may be movable along one or more axes, as well as providing any desired heating or cooling to the substrate 101 and photoresist 401 in order to prevent temperature gradients from affecting the exposure process.

In an embodiment the photoresist energy source 407 supplies photoresist energy 411 such as light to the photoresist 401 in order to induce a reaction of the PACs, which in turn reacts with the photoresist polymer resin to chemically alter those portions of the photoresist 401 to which the photoresist energy 411 impinges. In an embodiment the photoresist energy 411 may be electromagnetic radiation, such as g-rays (with a wavelength of about 436 nm), i-rays (with a wavelength of about 365 nm), ultraviolet radiation, far ultraviolet radiation, x-rays, electron beams, or the like. The photoresist energy source 407 may be a source of the electromagnetic radiation, and may be a KrF excimer laser light (with a wavelength of 248 nm), an ArF excimer laser light (with a wavelength of 193 nm), a F2 excimer laser light (with a wavelength of 157 nm), or the like, although any other suitable source of photoresist energy 411, such as mercury vapor lamps, xenon lamps, carbon arc lamps or the like, may alternatively be utilized. Any exposure wavelength may be used, such as between 10 nm and 450 nm, and all are fully intended to be included within the scope of the embodiments.

The patterned mask 409 is located between the photoresist energy source 407 and the photoresist 401 in order to block portions of the photoresist energy 411 to form a patterned energy 415 prior to the photoresist energy 411 actually impinging upon the photoresist 401. In an embodiment the patterned mask 409 may comprise a series of layers (e.g., substrate, absorbance layers, anti-reflective coating layers, shielding layers, etc.) to reflect, absorb, or otherwise block portions of the photoresist energy 411 from reaching those portions of the photoresist 401 which are not desired to be illuminated. The desired pattern may be formed in the patterned mask 409 by forming openings through the patterned mask 409 in the desired shape of illumination.

Optics (represented in FIG. 4 by the trapezoid labeled 413) may be used to concentrate, expand, reflect, or otherwise control the photoresist energy 411 as it leaves the photoresist energy source 407, is patterned by the patterned mask 409, and is directed towards the photoresist 401. In an embodiment the photoresist optics 413 comprise one or more lenses, mirrors, filters, combinations of these, or the like to control the photoresist energy 411 along its path. Additionally, while the photoresist optics 413 are illustrated in FIG. 4 as being between the patterned mask 409 and the photoresist 401, elements of the photoresist optics 413 (e.g., individual lenses, mirrors, etc.) may also be located at any location between the photoresist energy source 407 (where the photoresist energy 411 is generated) and the photoresist 401.

In an embodiment the semiconductor device 100 with the photoresist 401 is placed on the photoresist support plate 404. Once the pattern has been aligned to the semiconductor device 100, the photoresist energy source 407 generates the desired photoresist energy 411 (e.g., light) which passes through the patterned mask 409 and the photoresist optics 413 on its way to the photoresist 401. The patterned energy 415 impinging upon portions of the photoresist 401 induces a reaction of the PACs within the photoresist 401. The chemical reaction products of the PACs' absorption of the patterned energy 415 (e.g., acids/bases/free radicals) then reacts with the photoresist polymer resin, chemically altering the photoresist 401 in those portions that were illuminated through the patterned mask 409.

In a specific example in which the patterned energy 415 is a 193 nm wavelength of light, the PAC is a photoacid generator, and the group to be decomposed is a carboxylic acid group on the hydrocarbon structure and a cross linking agent is used, the patterned energy 415 will impinge upon the photoacid generator and the photoacid generator will absorb the impinging patterned energy 415. This absorption initiates the photoacid generator to generate a proton (e.g., an H+ atom) within the photoresist 401. When the proton impacts the carboxylic acid group on the hydrocarbon structure, the proton will react with the carboxylic acid group, chemically altering the carboxylic acid group and altering the properties of the photoresist polymer resin in general. The carboxylic acid group will then react with the photoresist cross-linking agent to cross-link with other photoresist polymer resin within the photoresist 401.

Optionally, the exposure of the photoresist 401 may occur using an immersion lithography technique. In such a technique an immersion medium (not individually illustrated in FIG. 4) may be placed between the photoresist imaging device 400 (and particularly between a final lens of the photoresist optics 413) and the photoresist 401. With this immersion medium in place, the photoresist 401 may be patterned with the patterned energy 415 passing through the immersion medium.

In this embodiment a protective layer (also not individually illustrated in FIG. 4) may be formed over the photoresist 401 in order to prevent the immersion medium from coming into direct contact with the photoresist 401 and leaching or otherwise adversely affecting the photoresist 401. In an embodiment the protective layer is insoluble within the immersion medium such that the immersion medium will not dissolve it and is immiscible in the photoresist 401 such that the protective layer will not adversely affect the photoresist 401. Additionally, the protective layer is transparent so that the patterned energy 415 may pass through the protective layer without hindrance.

In an embodiment the protective layer comprises a protective layer resin within a protective layer solvent. The material used for the protective layer solvent is, at least in part, dependent upon the components chosen for the photoresist 401, as the protective layer solvent should not dissolve the materials of the photoresist 401 so as to avoid degradation of the photoresist 401 during application and use of the protective layer. In an embodiment the protective layer solvent includes alcohol solvents, fluorinated solvents, and hydrocarbon solvents.

Specific examples of materials that may be utilized for the protective layer solvent include methanol, ethanol, 1-propanol, isopropanol, n-propanol, 1-butanol, 2-butanol, 2-methyl-2-propanol, 3-methyl-1-butanol, isobutyl alcohol, tert-butyl alcohol, 1-pentanol, 2-pentanol, 3-pentanol, n-hexanol, cyclohecanol, 1-hexanol, 1-heptanol, 1-octanol, 2-hexanol, 2-heptanol, 2-octanol, 3-hexanol, 3-heptanol, 3-octanol, 4-octanol, 2-methyl-2-butanol, 3-methyl-1-butanol, 3-methyl-2-butanol, 2-methyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 2,2,3,3,4,4-hexafluoro-1-butanol, 2,2,3,3,4,4,5,5-octafluoro-1-pentanol, 2,2,3,3,4,4,5,5,6,6-decafluoro-1-hexanol, 2,2,3,3,4,4-hexafluoro-1,5-pentanediol, 2,2,3,3,4,4,5,5-octafluoro-1,6-hexanediol, 2,2,3,3,4,4,5,5,6,6,7,7-dodecafluoro-1,8-diol, 2-fluoroanisole, 2,3-difluoroanisole, perfluorohexane, perfluoroheptane, perfluoro-2-pentanone, perfluoro-2-butyltetrahydrofuran, perfluorotetrahydrofuran, perfluorotributylamine, perfluorotetrapentylamine, toluene, xylene and anisole, and aliphatic hydrocarbon solvents, such as n-heptane, n-nonane, n-octane, n-decane, 2-methylheptane, 3-methylheptane, 3,3-dimethylhexane, 2,3,4-trimethylpentane, combinations of these, or the like.

The protective layer resin may, similar to the photoresist 401, comprise a protective layer repeating unit. In an embodiment the protective layer repeating unit may be an acrylic resin with a repeating hydrocarbon structure having a carboxyl group, an alicyclic structure, an alkyl group having one to five carbon atoms, a phenol group, or a fluorine atom-containing group. Specific examples of the alicyclic structure include a cyclohexyl group, an adamantyl group, a norbornyl group, an isobornyl group, a tricyclodecyl group, a tetracyclododecyl group, and the like. Specific examples of the alkyl group include an n-butyl group, an isobutyl group, or the like. However, any suitable protective layer resin may alternatively be utilized.

The protective layer composition may also include additional additives to assist in such things as adhesion, surface leveling, coating, and the like. For example, the protective layer composition may further comprise a protective layer surfactant, although other additives may also be added, and all such additions are fully intended to be included within the scope of the embodiment. In an embodiment the protective layer surfactant may be an alkyl cationic surfactant, an amide-type quaternary cationic surfactant, an ester-type quaternary cationic surfactant, an amine oxide surfactant, a betaine surfactant, an alkoxylate surfactant, a fatty acid ester surfactant, an amide surfactant, an alcohol surfactant, an ethylenediamine surfactant, or a fluorine- and/or silicon-containing surfactant.

Specific examples of materials that may be used for the protective layer surfactant include polyoxyethylene alkyl ethers, such as polyoxyethylene lauryl ether, polyoxyethylene stearyl ether, polyoxyethylene cetyl ether and polyoxyethylene oleyl ether; polyoxyethylene alkyl aryl ethers, such as polyoxyethylene octyl phenol ether and polyoxyethylene nonyl phenol ether; polyoxyethylene-polyooxypropylene block copolymers; sorbitan fatty acid esters, such as sorbitan monolaurate, sorbitan monopalmitate, sorbitan monostearate, sorbitan monooleate, sorbitan trioleate and sorbitan tristearate; and polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate.

Prior to application of the protective layer onto the photoresist 401, the protective layer resin and desired additives are first added to the protective layer solvent to form a protective layer composition. The protective layer solvent is then mixed to ensure that the protective layer composition has a consistent concentration throughout the protective layer composition.

Once the protective layer composition is ready for application, the protective layer composition may be applied over the photoresist 401. In an embodiment the application may be performed using a process such as a spin-on coating process, a dip coating method, an air-knife coating method, a curtain coating method, a wire-bar coating method, a gravure coating method, a lamination method, an extrusion coating method, combinations of these, or the like. In an embodiment the photoresist 401 may be applied such that it has a thickness over the surface of the photoresist 401 of about 100 nm.

After the protective layer composition has been applied to the photoresist 401, a protective layer pre-bake may be performed in order to remove the protective layer solvent. In an embodiment the protective layer pre-bake may be performed at a temperature suitable to evaporate the protective layer solvent, such as between about 40° C. and 150° C., although the precise temperature depends upon the materials chosen for the protective layer composition. The protective layer pre-bake is performed for a time sufficient to cure and dry the protective layer composition, such as between about 10 seconds to about 5 minutes, such as about 90 seconds.

Once the protective layer has been placed over the photoresist 401, the semiconductor device 100 with the photoresist 401 and the protective layer are placed on the photoresist support plate 404, and the immersion medium may be placed between the protective layer and the photoresist optics 413. In an embodiment the immersion medium is a liquid having a refractive index greater than that of the surrounding atmosphere, such as having a refractive index greater than 1. Examples of the immersion medium may include water, oil, glycerine, glycerol, cycloalkanols, or the like, although any suitable medium may alternatively be utilized.

The placement of the immersion medium between the protective layer and the photoresist optics 413 may be done using, e.g., an air knife method, whereby fresh immersion medium is applied to a region between the protective layer and the photoresist optics 413 and controlled using pressurized gas directed towards the protective layer to form a barrier and keep the immersion medium from spreading. In this embodiment the immersion medium may be applied, used, and removed from the protective layer for recycling so that there is fresh immersion medium used for the actual imaging process.

However, the air knife method described above is not the only method by which the photoresist 401 may be exposed using an immersion method. Any other suitable method for imaging the photoresist 401 using an immersion medium, such as immersing the entire substrate 101 along with the photoresist 401 and the protective layer, using solid barriers instead of gaseous barriers, or using an immersion medium without a protective layer, may also be utilized. Any suitable method for exposing the photoresist 401 through the immersion medium may be used, and all such methods are fully intended to be included within the scope of the embodiments.

After the photoresist 401 has been exposed to the patterned energy 415, a post-exposure baking may be used in order to assist in the generating, dispersing, and reacting of the acid/base/free radical generated from the impingement of the patterned energy 415 upon the PACs during the exposure. Such assistance helps to create or enhance chemical reactions which generate chemical differences between the exposed region 405 and the unexposed region 403 within the photoresist 401. These chemical differences also caused differences in the solubility between the exposed region 405 and the unexposed region 403. In an embodiment this post-exposure baking may occur at temperatures of between about 40° C. and about 200° C. for a period of between about 10 seconds and about 10 minutes.

Additionally, the photoresist imaging device 400 described above is also only intended to be illustrative and is not intended to limiting. Rather, any suitable imaging device, such as an e-beam imaging system, may alternatively be utilized. All such imaging systems are fully intended to be included within the scope of the embodiments.

FIG. 5 illustrates a development of the photoresist 401 with the use of a developer 501 after the photoresist 401 has been exposed. After the photoresist 401 has been exposed and the post-exposure baking has occurred, the photoresist 401 may be developed using either a positive tone developer or a negative tone developer, depending upon the desired pattern for the photoresist 401. In an embodiment in which the exposed region 405 of the photoresist 401 is desired to be removed to form a positive tone, a positive tone developer such as a basic aqueous solution may be utilized to remove those portions of the photoresist 401 which were exposed to the patterned energy 415 and which have had their solubility modified and changed through the chemical reactions. Such basic aqueous solutions may include tetra methyl ammonium hydroxide (TMAH, such as 2.38% TMAH), tetra butyl ammonium hydroxide, sodium hydroxide, potassium hydroxide, sodium carbonate, sodium bicarbonate, sodium silicate, sodium metasilicate, aqueous ammonia, monomethylamine, dimethylamine, trimethylamine, monoethylamine, diethylamine, triethylamine, monoisopropylamine, diisopropylamine, triisopropylamine, monobutylamine, dibutylamine, monoethanolamine, diethanolamine, triethanolamine, dimethylaminoethanol, diethylaminoethanol, ammonia, caustic soda, caustic potash, sodium metasilicate, potassium metasilicate, sodium carbonate, tetraethylammonium hydroxide, combinations of these, or the like.

If a negative tone development is desired, an organic solvent or critical fluid may be utilized to remove those portions of the photoresist 401 which were not exposed to the energy and, as such, retain their original solubility. Specific examples of materials that may be utilized include hydrocarbon solvents, alcohol solvents, ether solvents, ester solvents, critical fluids, combinations of these, or the like. Specific examples of materials that can be used for the negative tone solvent include hexane, heptane, octane, toluene, xylene, dichloromethane, chloroform, carbon tetrachloride, trichloroethylene, methanol, ethanol, propanol, butanol, critical carbon dioxide, diethyl ether, dipropyl ether, dibutyl ether, ethyl vinyl ether, dioxane, propylene oxide, tetrahydrofuran, cellosolve, methyl cellosolve, butyl cellosolve, methyl carbitol, diethylene glycol monoethyl ether, acetone, methyl ethyl ketone, methyl isobutyl ketone, isophorone, cyclohexanone, methyl acetate, ethyl acetate, propyl acetate, butyl acetate, pyridine, formamide, N,N-dimethyl formamide, or the like.

However, as one of ordinary skill in the art will recognize, the above description of positive tone developers and negative tone developers are only intended to be illustrative and are not intended to limit the embodiments to only the developers listed above. Rather, any suitable type of developer, including acid developers or even water developers, that may be utilized to selectively remove a portion of the photoresist 401 that has a different property (e.g., solubility) than another portion of the photoresist 401, may alternatively be utilized, and all such developers are fully intended to be included within the scope of the embodiments.

In an embodiment in which immersion lithography is utilized to expose the photoresist 401 and a protective layer is utilized to protect the photoresist 401 from the immersion medium, the developer 501 may be chosen to remove not only those portions of the photoresist 401 that are desired to be removed, but may also be chosen to remove the protective layer in the same development step. Alternatively, the protective layer may be removed in a separate process, such as by a separate solvent from the developer 501 or even an etching process to remove the protective layer from the photoresist 401 prior to development.

FIG. 5 illustrates an application of the developer 501 to the photoresist 401 using, e.g., a spin-on process. In this process the developer 501 is applied to the photoresist 401 from above the photoresist 401 while the semiconductor device 100 (and the photoresist 401) is rotated. In an embodiment the developer 501 may be supplied at a flow rate of between about 100 c.c./min and about 2000 c.c./min, such as about 600 c.c./min, while the semiconductor device 100 is being rotated at a speed of between about 300 rpm and about 3000 rpm, such as about 2000 rpm. In an embodiment the developer 501 may be at a temperature of between about 10° C. and about 80° C., such as about 50° C., and the development may continue for between about 1 minute to about 60 minutes, such as about 30 minutes.

However, while the spin-on method described herein is one suitable method for developing the photoresist 401 after exposure, it is intended to be illustrative and is not intended to limit the embodiments. Rather, any suitable method for development, including dip processes, puddle processes, and spray-on processes, may alternatively be used. All such development processes are fully intended to be included within the scope of the embodiments.

FIG. 5 illustrates a cross-section of the development process in an embodiment in which a negative tone developer is used to remove the unexposed regions of the photoresist 401. As illustrated, the developer 501 is applied to the photoresist 401 and dissolves the unexposed region 403 of the photoresist 401. This dissolving and removing of the unexposed region 403 of the photoresist 401 leaves behind an opening within the photoresist 401 that patterns the photoresist 401 in the shape of the patterned energy 415, thereby transferring the pattern of the patterned mask 409 to the photoresist 401.

Figure 6:
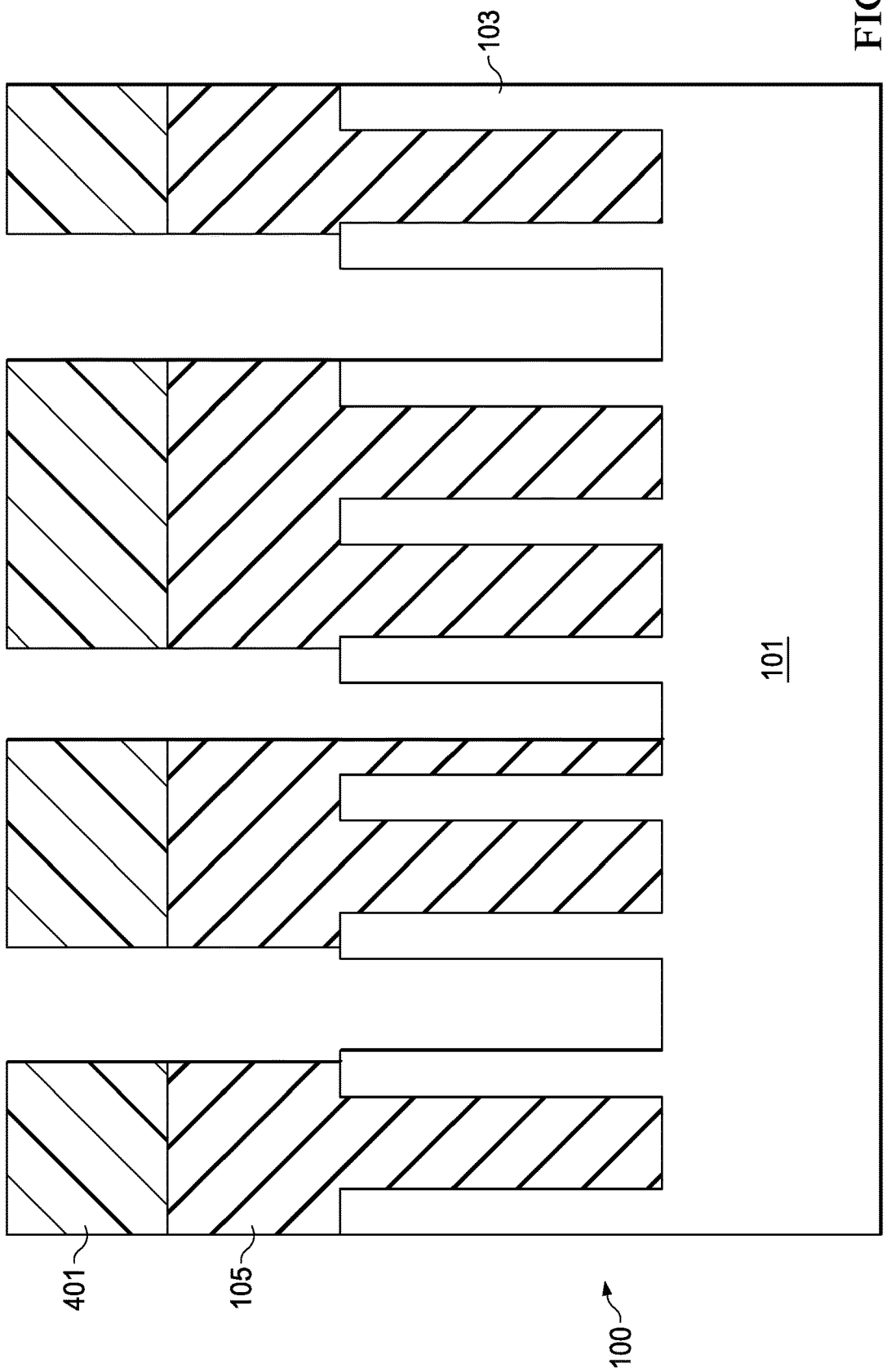
FIG. 6 illustrates a removal of exposed portions of the bottom anti-reflective layer in accordance with some embodiments.

FIG. 6 illustrates that, once the photoresist 401 has been patterned, the pattern may be transferred to the coating material 105. In an embodiment in which the coating material 105 remains insoluble to the developer 501, the coating material 105 may be removed using an etching process that utilizes the photoresist 401 (now patterned) as a masking layer. The etching process may be a dry etch process utilizing an etchant such as oxygen, nitrogen, hydrogen, ammonia, sulfur hexafluoride, difluoromethane, nitrogen trifluoride, chlorine trifluoride, chlorine, carbon monoxide, carbon dioxide, helium, boron dichloride, argon, fluorine, trifluoromethane, tetrafluoromethane, perfluorocyclobutane, perfluoropropane, combinations of these, or the like. However, any other suitable etch process, such as a wet etch, and any other suitable etchants may alternatively be used.

Additionally, the coating material 105 may have a different etch rate than the substrate 101 and the fins 103. In a particular embodiment the etch selectivity is greater than 1 between the substrate 101 and the coating material 105. This allows the coating material 105 to be patterned separately from the substrate 101 or the fins 103.

Alternatively, in an embodiment in which the coating material 105 comprises an acid labile group that can react to de-crosslink the cross-linked polymers in the coating material 105 and change the solubility of the coating material 105, the coating material 105 may be patterned during the development process by the developer 501. In particular, during exposure the photoacid generators may generate an acid in the coating material 105, which will work to break the cross-linking bonds and change the solubility of the coating material 105. Then, in a positive tone development process, a positive tone developer may be used to remove both the photoresist 401 that had been exposed as well as to remove the coating material 105 in the same process. Any suitable patterning process, with any suitable number of steps, may be utilized to pattern and remove both the photoresist 401 and the coating material 105, and all such processes and steps are fully intended to be included within the scope of the embodiments.

By using the coating material 105 as described above, the coating material 105 can better fill the gaps between closely spaced structures such as the fins 103. By providing a better gap filling, fewer defects from an improper fill can be achieved, thereby improving efficiency and yield during the manufacturing of semiconductor devices.

Figure 7:
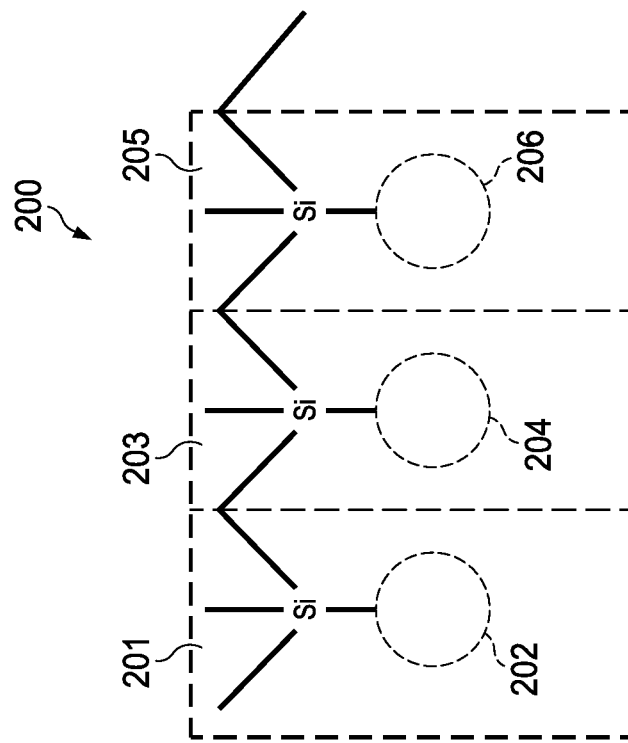
FIG. 7 illustrates an inorganic structure of the polymer resin in accordance with some embodiments.

FIG. 7 illustrates an alternative embodiment of the polymer resin 200 within the BARC layer 103. In this embodiment, while the polymer resin 200 still comprises the surface energy modification monomer 201 (with the surface energy modification group 202), the chromophore monomer 203 (with the chromophore group 204), and the cross-linking monomer 205 (with the cross-linking group 206), at least one of the surface energy modification monomer 201, the chromophore monomer 203, and the cross-linking monomer 205 comprises an inorganic component.

In a particular embodiment illustrated in FIG. 7, the inorganic component may comprise a silicon atom and the surface energy modification group 202 may be bonded to the silicon atom within the surface energy modification monomer 201. Alternatively, the chromophore group 204 may be bonded to the inorganic component within the chromophore monomer 203, or the cross-linking group 206 may be bonded to the inorganic component within the cross-linking monomer 205. Any suitable combination of inorganic component within any of the surface energy modification monomer 201, the chromophore monomer 203, or the cross-linking monomer By utilizing an inorganic material within the monomers, the surface energy of the coating material 105 may be modified. Additionally, if it is modified so that the surface energy of the coating material 105 is similar to the surface energy of the underlying material (e.g., the substrate 101 and fins 103), capillary forces may be used to pull the coating material 105 into small spaces between structures such as the fins 103. This will then help with filling the gaps and preventing defects that may arise from an inconsistent filling of the coating material 105.

In one embodiment the surface energy modification monomer 201 with the energy modification group 202 may be used to increase the surface energy of the coating material 105. In such an embodiment, to raise the surface energy of the coating material 105, the surface energy modification group 202 comprises one or more of a hydroxyl group, a carboxyl group, an amine group, or an amide group. In a particular embodiment the surface energy modification monomer 201 may have a structure such as the following:

Where $R_6$ and $R_7$ collectively make up the surface energy modification group 202 and where $R_6$ is an alkyl group with hydrogen attached to the hydrocarbons and wherein $R_6$ may have a straight, branched or cyclic structure. The alkyl group within $R_6$ may also comprise hetero atoms, such as containing nitrogen or oxygen atoms. $R_7$ may contain at least one of a hydroxyl, carboxyl, amine, or amide group.

In particular embodiments, the surface energy modification monomer 201 may comprise an acrylic acid group, a methacrylic acid group, or a hydrostyrene group. In an embodiment in which the surface energy modification monomer 201 comprises silicon and the surface energy modification group 202 is hydrostyrene, the surface energy modification monomer 201 may have the following structure:

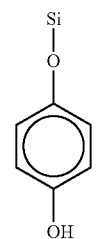

In an embodiment in which the surface energy modification monomer 201 comprises silicon and the surface energy modification group 202 is a hydroxyl group, the surface energy modification monomer 201 may have the following structure:

In an embodiment in which the surface energy modification monomer 201 comprises silicon and the surface energy modification group 202 is a methacrylic acid group, the surface energy modification monomer 201 may have the following structure:

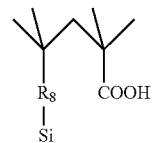

Where $R_8$ is an alkyl group with a between one and six carbons that has a straight branched, or cyclic structure, a phenol group in which the silicon atom is attached to an oxygen atom, or a group which can decompose.

In an embodiment in which the surface energy modification monomer 201 comprises silicon and the surface energy modification group 202 is an acrylic monomer, the surface energy modification monomer 201 may have the following structure:

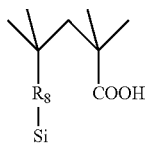

Where $R_8$ is an alkyl group with a between one and six carbons that has a straight branched, or cyclic structure, a phenol group in which the silicon atom is attached to an oxygen atom, or a group which can decompose.

However, as one of ordinary skill in the art will recognize, the precise structures and examples described to raise the surface energy of the coating material 105 are intended to be illustrative and are not intended to be limiting. Rather, any suitable functional group that would raise the surface energy of the coating material 105 may alternatively be utilized. These are all fully intended to be included within the scope of the embodiments.

Alternatively, the surface energy modification monomer 201 with an inorganic component may be used to decrease the surface energy of the coating material 105. In such an embodiment, to decrease the surface energy of the coating material 105, the surface energy modification group 202 in the surface energy modification monomer 201 comprises one or more of an alkyl group, a fluoro group, or a benzyl group. In particular embodiments, the surface energy modification monomer 201 may comprise a linear, branched, or cyclic alkyl or fluoro functional group.

In a particular embodiment the surface energy modification monomer 201 may have a structure such as the following:

Where $R_9$ and $R_{10}$ collectively form the surface energy modification group 202 and where $R_9$ is an alkyl group with hydrogen attached to the hydrocarbons and wherein $R_9$ may have a straight, branched, or cyclic structure. The alkyl group within $R_9$ may also comprise hetero atoms, such as containing nitrogen or oxygen atoms. However, in this embodiment, $R_{10}$ may contain at least one of an alkyl, fluoro, benzyl group, and may comprise a linear, branched, or cyclic alkyl or fluoro group. For example, in some embodiments the surface energy modification monomer 201 may have one of the following structures:

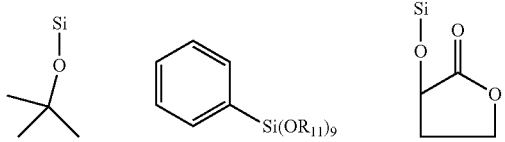

Where $R_{11}$ is an alkyl with from one to six carbon atoms.

Additionally in this embodiment, the inorganic element (e.g., silicon) is not limited to being only present on the polymer backbone. Rather, the inorganic element may be placed anywhere within the polymer resin 200. As one example, the cross-linking monomer 205 may be formed with an inorganic functional group, such as silicon ethoxyl or silicon methoxyl, although any other suitable cross-linking material may also be utilized.

In particular embodiments, the cross-linking monomer 205 may have the following structures:

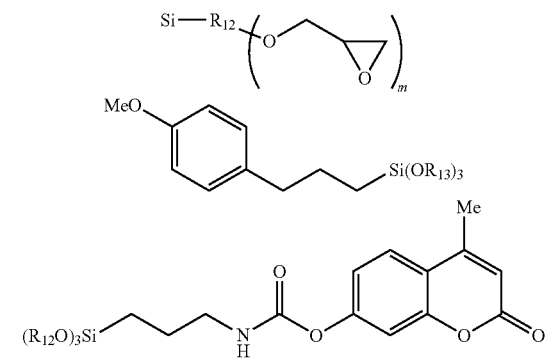

Where $R_{12}$ comprises an alkyl group with hydrogen attached to the hydrocarbon structure, wherein the alkyl group may have a straight, branched, or cyclic structure, Me is a methyl group, and $R_{13}$ is an alkyl group with between one and six carbons. Additionally, alkyl group may also comprise a hetero atom, such as comprising a nitrogen atom or an oxygen or fluorine atom, or even an alkyl fluoride.

However, as one of ordinary skill in the art will recognize, the precise structures described above are intended to be illustrative only and are not intended to be limiting to the embodiments, Rather, any suitable group for modifying the surface energy of the polymer resin along with an inorganic component, such as the groups described in U.S. Pat. No. 8,524,851 to Kim et al., entitled "Silicon-based Hardmask Composition and Process of Producing Semiconductor Integrated Circuit Device Using the Same," which is hereby incorporated herein by reference, may alternatively be used. All such groups are fully intended to be included within the scope of the embodiments.

In this embodiment with an inorganic component, the surface energy modification monomer 201 may have a loading within the polymer resin 200 of between about 1% and about 100%, such as about 80%. Also, the chromophore monomer 203 may have a loading within the polymer resin 200 of between about 0% and about 100%, such as about 5%, and the cross-linking monomer 205 may have a loading of between about 0% and about 100%, such as about 5%. However, these descriptions are intended to be illustrative as any suitable loading between the various monomers of the polymer resin 200 may be used, and all such loadings are fully intended to be included within the scope of the embodiments.

Figure 8A:
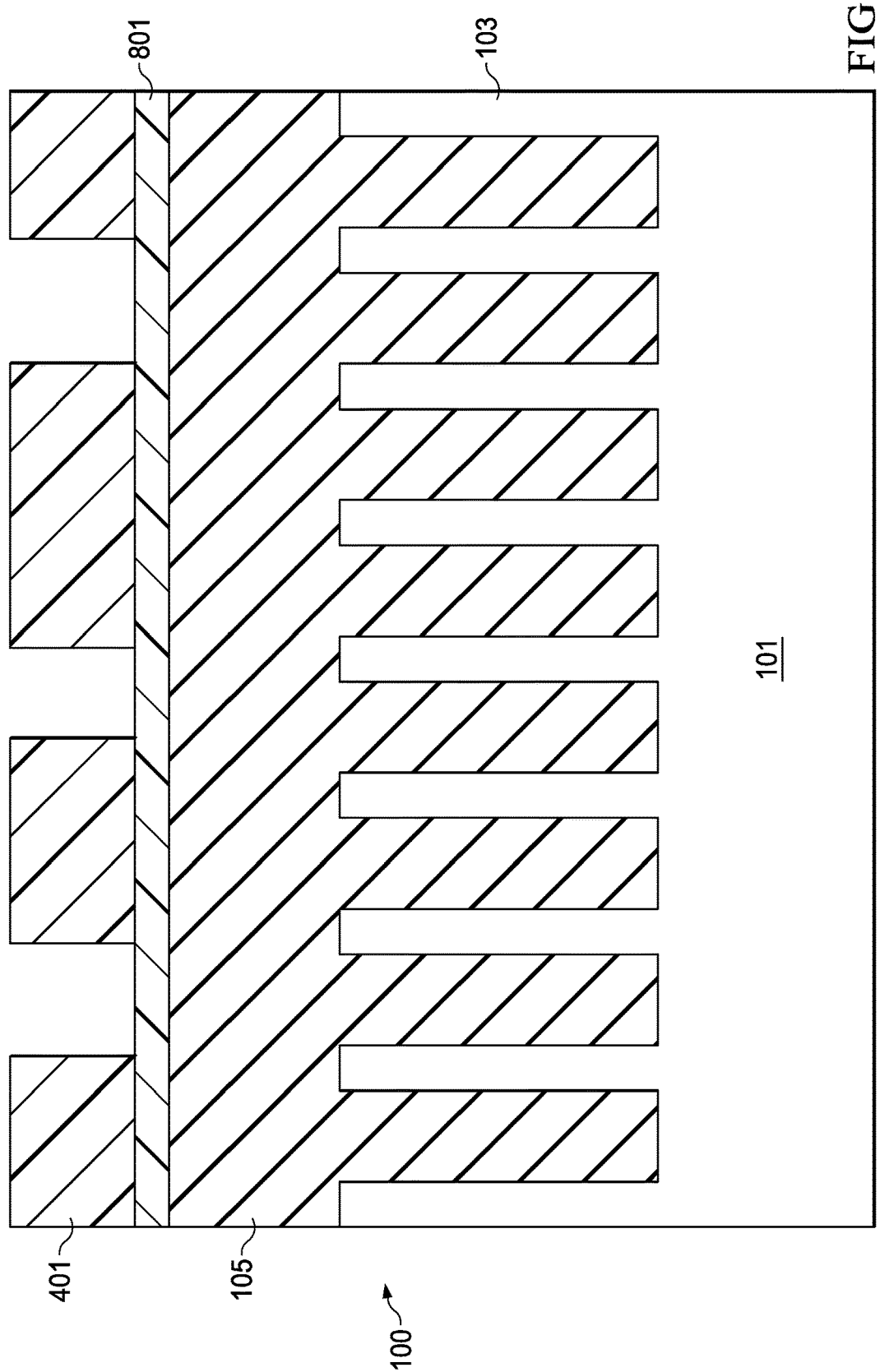
FIGS. 8A-8B illustrate the use of an intermediate masking layer along with the bottom anti-reflective layer in accordance with some embodiments.
Figure 8B:
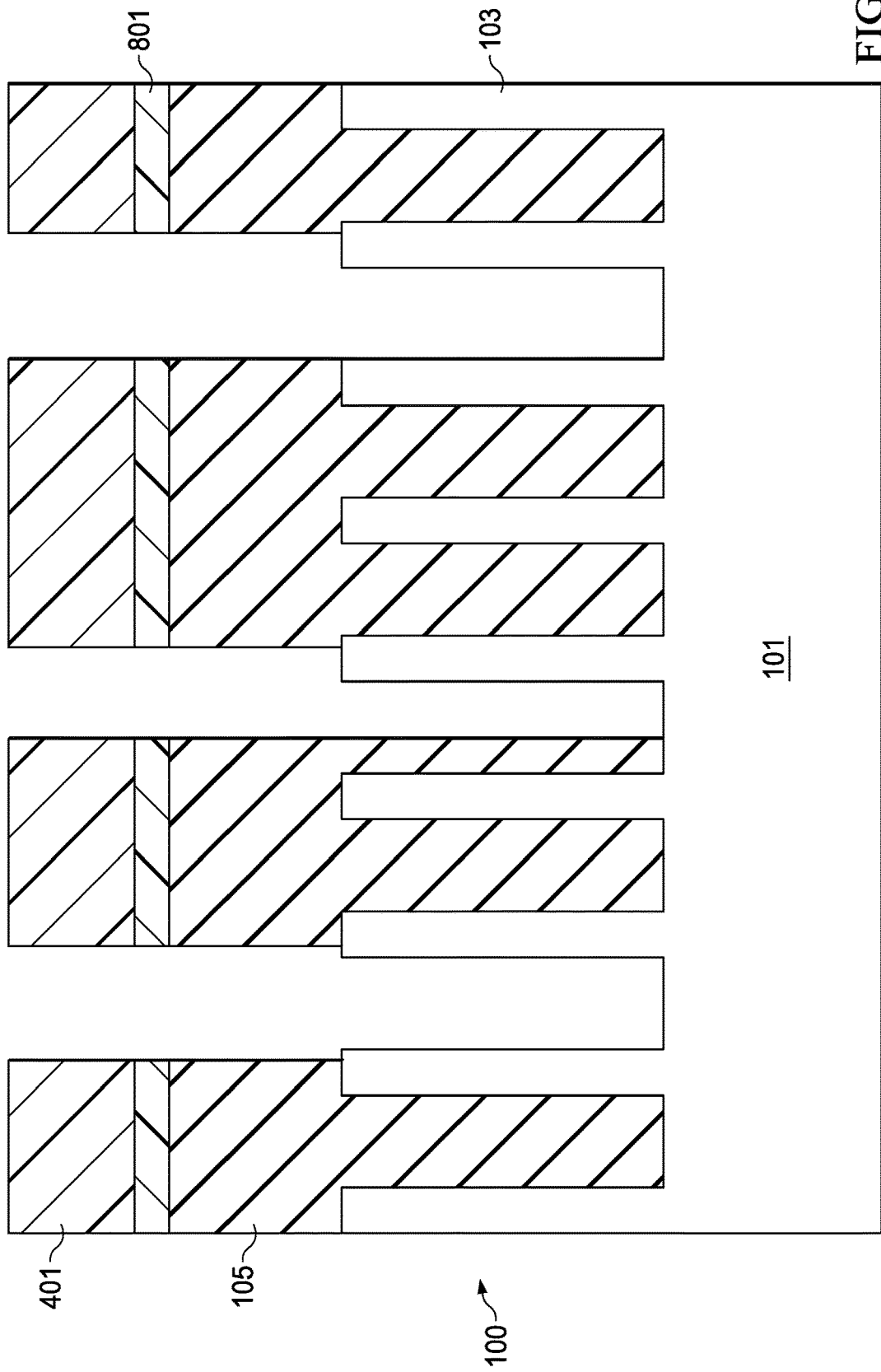

FIGS. 8A-8B illustrate another embodiment wherein the coating material 105, instead of simply being utilized as an anti-reflective coating, is utilized as an underlayer along with a hard mask layer 801. In such an embodiment the coating material 105 may be formed as described above with respect to FIG. 1. Once formed, however, instead of placing the photoresist 401 directly on the coating material 105, a hard mask layer 801 is formed on the coating material 105.

In an embodiment the hard mask layer 801 may be a hardmask material such as silicon nitride, oxides, oxynitrides, silicon carbide, combinations of these, or the like. The hardmask material for the hard mask layer 801 may be formed through a process such as chemical vapor deposition (CVD), although other processes, such as plasma enhanced chemical vapor deposition (PECVD), low pressure chemical vapor deposition (LPCVD), spin-on coating, or even silicon oxide formation followed by nitridation, may alternatively be utilized. Any suitable method or combination of methods to form or otherwise place the hardmask material may be utilized, and all such methods or combination are fully intended to be included within the scope of the embodiments. The hard mask layer 801 may be formed to a thickness of between about 100 Å and about 800 Å, such as about 300 Å.

Once a layer of the hardmask material for the hard mask layer 801 has been formed, the photoresist 401 may be placed and patterned over the hard mask material for the hard mask layer 801. The placement of the photoresist 401 over the hard mask material for the hard mask layer 801 and the patterning of the photoresist 401 may be similar to the placement of the photoresist 401 and the development of the photoresist as described above with respect to FIG. 4. For example, the photoresist 401 may be placed using a spin-on process, illuminated using the photoresist imaging device 400, and then developed using the developer 501.

FIG. 8B illustrates that, once the photoresist 401 has been patterned into the desired pattern, the photoresist 401 may be used as a mask to pattern the hard mask material of the hard mask layer 801. For example, the pattern of the photoresist 401 may be transferred to the hard mask layer 801 using a anisotropic etching process such as reactive ion etching (RIE), whereby ions of a suitable etchant such as $CF_4$—$O_2$, may be utilized in a dry etch to remove portions of the hard mask layer 801 exposed by the patterned photoresist 401. However, any other suitable etchant, such as $CHF_2/O_2$, $CH_2F_2$, $CH_3F$, or the like, and any other suitable method of removal, may alternatively be used.

FIG. 8B further illustrates that once the pattern of the photoresist 401 has been transferred to the hard mask layer 801, the hard mask layer 801 may be used to transfer the pattern of the photoresist 401 to the coating material 105. In an embodiment the coating material 105 may be removed using an etching process that utilizes the photoresist 401 and the hard mask layer 801 (now patterned) as a masking layer. The etching process may be a dry etch process utilizing an etchant such as oxygen, nitrogen, hydrogen, ammonia, sulfur hexafluoride, difluoromethane, nitrogen trifluoride, chlorine trifluoride, chlorine, carbon monoxide, carbon dioxide, helium, boron dichloride, argon, fluorine, trifluoromethane, tetrafluoromethane, perfluorocyclobutane, perfluoropropane, combinations of these, or the like. However, any other suitable etch process, such as a wet etch, and any other suitable etchants may alternatively be used.

By utilizing the coating material 105 as an underlayer along with a hard mask layer 801, a more uniform layer may be formed over a variety of different underlying terrains. By creating a more uniform layer, subsequent processing may be better controlled, leading to a more efficient manufacturing process capable of making devices with smaller and smaller dimensions.

In accordance with an embodiment, a method of manufacturing a semiconductor device comprising placing a bottom anti-reflective coating layer onto a substrate, wherein the bottom anti-reflective coating layer comprises a surface energy modification monomer, is provided. A photoresist is placed and patterned over the bottom anti-reflective coating layer, and a portion of the bottom anti-reflective coating layer is removed through the photoresist.

In accordance with another embodiment, a method of manufacturing a semiconductor device comprising placing a bottom anti-reflective coating into openings of a substrate, wherein the bottom anti-reflective coating comprises a polymer resin is provided. The polymer resin comprises a chromophore unit, a cross-linking unit, and a surface energy modification unit. A photoresist is placed over the bottom anti-reflective coating, and the photoresist is patterned to expose at least a portion of the bottom anti-reflective coating. The bottom anti-reflective coating is patterned using the photoresist as a mask.

In accordance with another embodiment, a method of manufacturing a semiconductor device comprising applying a first material into openings within a substrate, wherein the first material comprises a polymer resin is provided. The polymer resin comprises a chromophore unit, a cross-linking unit, and a surface energy modification unit, wherein at least one of the chromophore unit, the cross-linking unit, and the surface energy modification unit is an inorganic group.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A coating material comprising:
    a polymer resin comprising:
        a chromophore repeating unit;
        a cross-linking repeating unit; and
        a surface energy modification repeating unit, wherein the surface energy modification repeating unit has the structure:

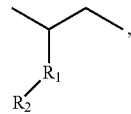

wherein $R_1$ comprises an alkyl group and $R_2$ comprises at least one of a hydroxyl group, a carboxyl group, an amine group, an amide group, a benzyl group, or a fluoro group;
    a catalyst; and
    a solvent.

2. The coating material of claim 1, wherein the chromophore repeating unit comprises a vinyl compound.

3. The coating material of claim 1, wherein the chromophore repeating unit comprises benzene.

4. The coating material of claim 1, wherein the cross-linking repeating unit comprises an inorganic functional group.

5. The coating material of claim 1, wherein the catalyst comprises a thermal acid generator, a photoacid generator, or a photobase generator.

6. The coating material of claim 1, wherein the catalyst comprises an amine.

7. The coating material of claim 1, further comprising a surface leveling agent.

8. An anti-reflective coating comprising:
a polymer resin, the polymer resin comprising:
a chromophore repeating unit;
a cross-linking repeating unit; and
a surface energy modification repeating unit having the structure:

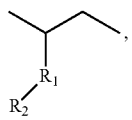

wherein $R_1$ comprises an alkyl group and $R_2$ comprises at least one of a hydroxyl group, a carboxyl group, an amine group, an amide group, a benzyl group, or a fluoro group.

9. The anti-reflective coating of claim 8, wherein the cross-linking repeating unit and the chromophore repeating unit each comprise an inorganic component.

10. The anti-reflective coating of claim 9, wherein the inorganic component comprises silicon, wherein the chromophore repeating unit comprises a chromophore group bonded to the inorganic component, and wherein the cross-linking repeating unit comprises a cross-linking group bonded to the inorganic component.

11. The anti-reflective coating of claim 8, wherein the chromophore repeating unit comprises oxygen, nitrogen, or sulfur.

12. The anti-reflective coating of claim 8, wherein the cross-linking repeating unit comprises an acid labile group.

13. The anti-reflective coating of claim 8, further comprising a catalyst comprising an amine.

14. An anti-reflective coating comprising:
a polymer resin, the polymer resin comprising:
a chromophore unit;
a cross-linking unit, wherein the cross-linking unit has the structure:

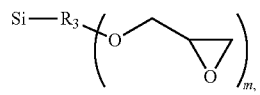

wherein $R_3$ comprises an alkyl group; and
a surface energy modification unit, wherein the surface energy modification unit has the structure:

wherein $R_1$ comprises an alkyl group and $R_2$ comprises at least one of a fluoro group or a benzyl group.

15. The anti-reflective coating of claim 14, wherein R1 further comprises oxygen or nitrogen.

16. The anti-reflective coating of claim 14, wherein the cross-linking unit comprises silicon ethoxyl.

17. The anti-reflective coating of claim 14, wherein the cross-linking unit comprises silicon methoxyl.

18. The anti-reflective coating of claim 14, wherein $R_1$ has a cyclic structure.

19. The anti-reflective coating of claim 14, wherein $R_1$ has a branched structure.

20. The anti-reflective coating of claim 14, wherein $R_1$ comprises nitrogen or oxygen.

* * * * *